US010134665B2

(12) United States Patent
Kobayashi et al.

(10) Patent No.: US 10,134,665 B2
(45) Date of Patent: Nov. 20, 2018

(54) SEMICONDUCTOR DEVICE

(71) Applicant: Renesas Electronics Corporation, Tokyo (JP)

(72) Inventors: Tatsuya Kobayashi, Tokyo (JP); Soshi Kuroda, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/563,214

(22) PCT Filed: Jul. 3, 2015

(86) PCT No.: PCT/JP2015/069294
§ 371 (c)(1),
(2) Date: Sep. 29, 2017

(87) PCT Pub. No.: WO2017/006391
PCT Pub. Date: Jan. 12, 2017

(65) Prior Publication Data
US 2018/0090429 A1      Mar. 29, 2018

(51) Int. Cl.
*H01L 23/495* (2006.01)
*H01L 23/498* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ........... H01L 21/4857; H01L 23/49822; H01L 21/4853; H01L 21/561; H01L 23/49816;
(Continued)

(56) References Cited

U.S. PATENT DOCUMENTS 6,124,553 A    9/2000  Narizuka et al.
6,930,258 B1 * 8/2005  Kawasaki ......... H01L 23/49811
                                                  174/255
(Continued)

FOREIGN PATENT DOCUMENTS

JP    6-104350 A    4/1994
JP    7-099265 A    4/1995
(Continued)

OTHER PUBLICATIONS

International Search Report for PCT/JP2015/069294, dated Sep. 15, 2015.
(Continued)

*Primary Examiner* — Luan C Thai
(74) *Attorney, Agent, or Firm* — Sughrue Mion, PLLC

(57) ABSTRACT

A BGA 9 includes a wiring substrate 2, a semiconductor chip 1 fixed on the wiring substrate 2, a sealing body 4 that seals the semiconductor chip 1, and a plurality of solder balls 5 provided on a lower surface of the wiring substrate 2. A degree of flatness of an upper surface 2*ia* of a first wiring layer 2*i* of the wiring substrate 2 of the BGA 9 is lower than a degree of flatness of a lower surface 2*ib*, and a first pattern 2*jc* provided in a second wiring layer 2*j* is arranged at a position overlapping a first pattern 2*ic* provided in the first wiring layer 2*i*. Also, an area of the first pattern 2*ic* provided in the first wiring layer 2*i* is larger than an area of a plurality of (for example, two) second patterns 2*jd* provided in the second wiring layer 2*j* in a plan view, and a first opening portion 2*jm* through which a part of a second insulating layer 2*h* is exposed is formed in the first pattern 2*jc* provided in the second wiring layer 2*j*.

16 Claims, 32 Drawing Sheets

(51) Int. Cl.
　　　*H01L 23/12* (2006.01)
　　　*H01L 23/36* (2006.01)
　　　*H01L 21/48* (2006.01)
　　　*H01L 21/56* (2006.01)
　　　*H01L 21/78* (2006.01)
　　　*H01L 23/31* (2006.01)
　　　*H01L 23/367* (2006.01)
　　　*H01L 23/00* (2006.01)

(52) U.S. Cl.
　　　CPC .......... *H01L 21/561* (2013.01); *H01L 21/565* (2013.01); *H01L 21/78* (2013.01); *H01L 23/12* (2013.01); *H01L 23/3114* (2013.01); *H01L 23/36* (2013.01); *H01L 23/367* (2013.01); *H01L 23/49816* (2013.01); *H01L 23/49822* (2013.01); *H01L 24/32* (2013.01); *H01L 24/48* (2013.01); *H01L 24/73* (2013.01); *H01L 24/97* (2013.01); *H01L 2224/32225* (2013.01); *H01L 2224/48091* (2013.01); *H01L 2224/48227* (2013.01); *H01L 2224/48465* (2013.01); *H01L 2224/49171* (2013.01); *H01L 2224/73265* (2013.01); *H01L 2224/97* (2013.01); *H01L 2924/15311* (2013.01); *H01L 2924/181* (2013.01)

(58) Field of Classification Search
　　　CPC ....... H01L 24/97; H01L 21/565; H01L 21/56; H01L 24/73; H01L 24/48; H01L 21/78; H01L 24/32; H01L 23/367
　　　USPC ........................................................ 257/668
　　　See application file for complete search history.

(56) References Cited

U.S. PATENT DOCUMENTS

| | | | |
|---|---|---|---|
| 7,446,263 B2 * | 11/2008 | En | C25D 3/38 174/258 |
| 8,110,750 B2 * | 2/2012 | Inagaki | H01L 21/4857 174/260 |
| 8,242,379 B2 * | 8/2012 | Ikeda | H01L 21/4857 174/261 |
| 2003/0043556 A1 | 3/2003 | Sugimoto et al. | |
| 2006/0103004 A1 | 5/2006 | Sakai et al. | |
| 2011/0169165 A1 | 7/2011 | Ajiro | |
| 2012/0067635 A1 | 3/2012 | Nang et al. | |
| 2014/0138836 A1 | 5/2014 | Nagasawa | |
| 2015/0221604 A1 | 8/2015 | Nagasawa | |

FOREIGN PATENT DOCUMENTS

| | | |
|---|---|---|
| JP | 9-153679 A | 6/1997 |
| JP | 10-303334 A | 11/1998 |
| JP | 2003-78062 A | 3/2003 |
| JP | 2005-353835 A | 12/2005 |
| JP | 2006-147676 A | 6/2006 |
| JP | 2008-235629 A | 10/2008 |
| JP | 2011-146513 A | 7/2011 |
| JP | 2012-64911 A | 3/2012 |
| JP | 2014-103152 A | 6/2014 |
| JP | 2014-123783 A | 7/2014 |

OTHER PUBLICATIONS

Communication dated Mar. 20, 2018 issued by the Japanese Patent Office in counterpart Japanese application No. 2017-526799.
Communication dated Jul. 24, 2018, from the Japanese Patent Office in counterpart application No. 2017-526799.

* cited by examiner

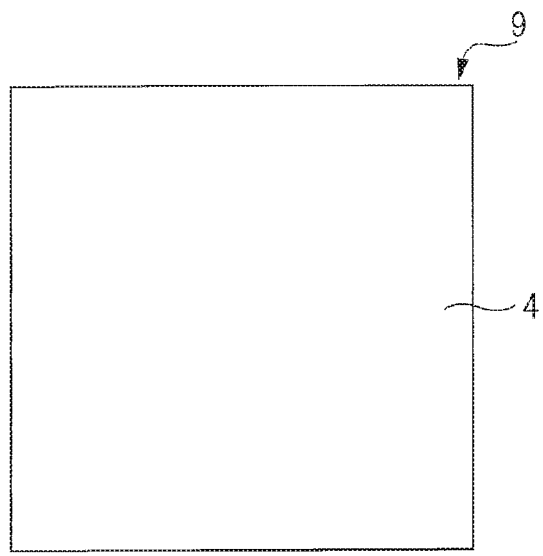
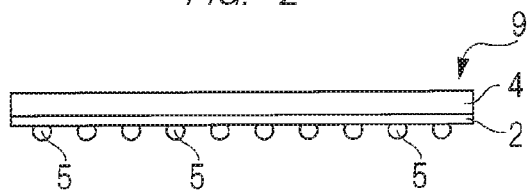
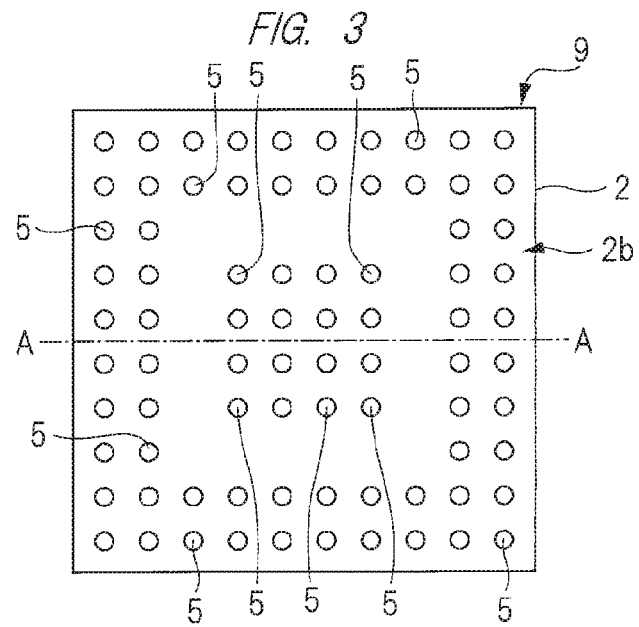

FIG. 18
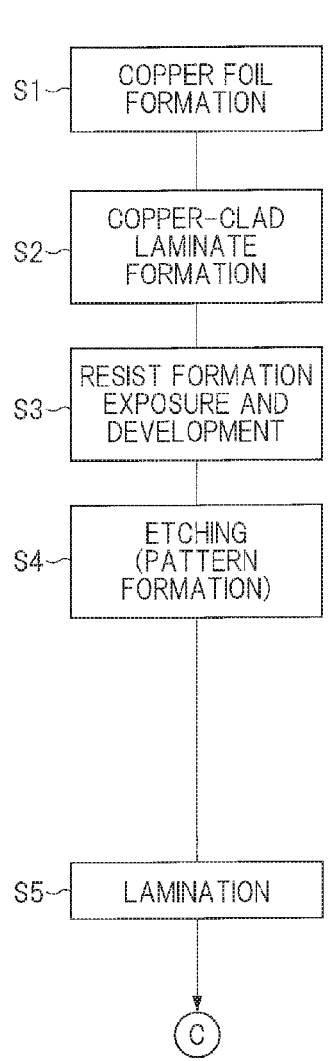
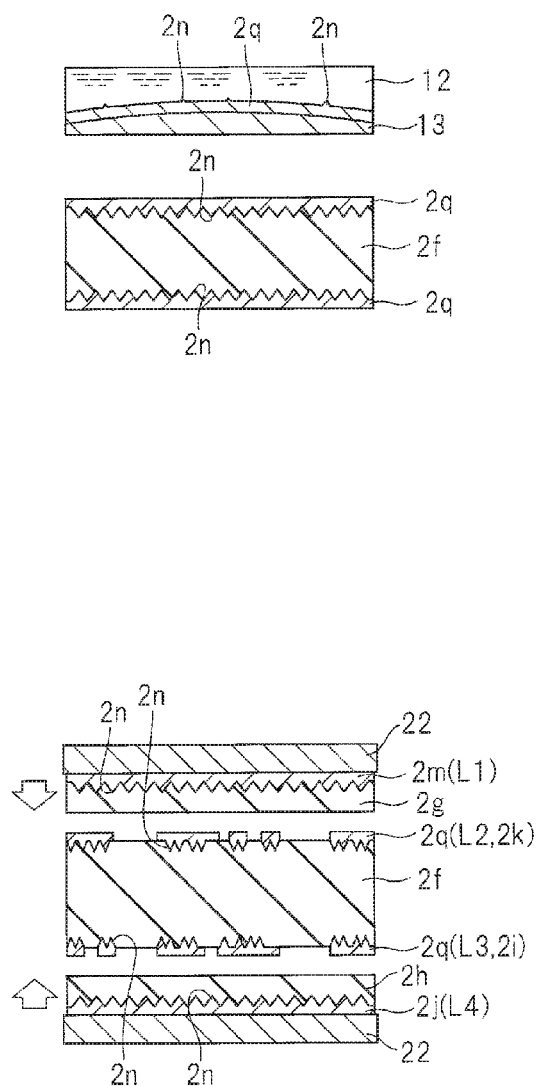

FIG. 20
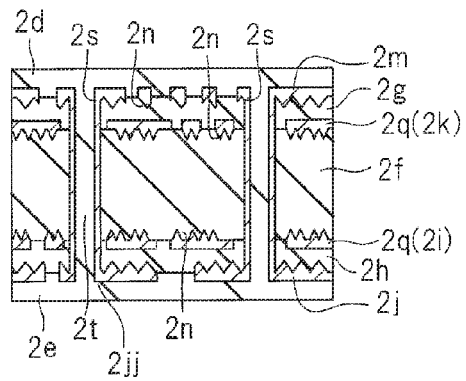
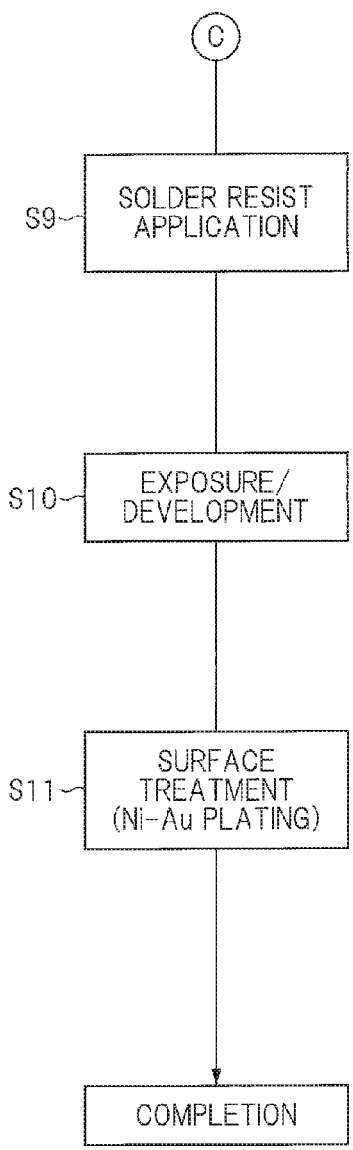
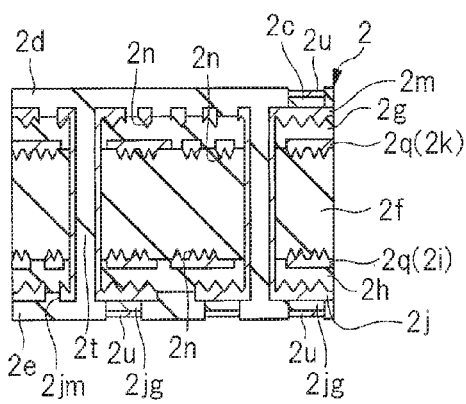

SEMICONDUCTOR DEVICE

CROSS REFERENCE TO RELATED APPLICATIONS

This application is a National Stage of International Application No. PCT/JP2015/069294 filed Jul. 3, 2015 the contents of all of which are incorporated herein by reference in their entirety.

TECHNICAL FIELD

The present invention relates to a semiconductor device, for example, a technique effectively applied to a semiconductor device in which a semiconductor chip is mounted on a multilayer wiring substrate.

BACKGROUND ART

In a semiconductor device having a multilayer wiring substrate, a pattern for heat dissipation or a pattern for power supply/GND having a large area is provided in the lowermost wiring layer of the multilayer wiring substrate in order to improve the electrical characteristics and ensure the heat dissipation path. Further, in a pattern for heat dissipation of a BGA (Ball Grid Array), for example, a plurality of solder balls for heat dissipation are provided, so that the heat is conducted to the mounting board (mother board) via these solder balls.

Note that a structure of a plastic wiring substrate having two wiring layers is disclosed in, for example, Japanese Patent Application Laid-Open Publication No. H10-303334 (Patent Document 1). Also, a structure of a multilayer wiring substrate having four wiring layers is disclosed in, for example, Japanese Patent Application Laid-Open Publication No. 2006-147676 (Patent Document 2) and Japanese Patent Application Laid-Open Publication No. 2014-123783 (Patent Document 3). Further, a land for a solder ball of the NSMD (Non-Solder Mask Defined) structure in a wiring substrate is disclosed in, for example, Japanese Patent Application Laid-Open Publication No. 2014-103152 (Patent Document 4).

RELATED ART DOCUMENTS

Patent Documents

Patent Document 1: Japanese Patent Application Laid-Open Publication No. H10-303334
Patent Document 2: Japanese Patent Application Laid-Open Publication No. 2006-147676
Patent Document 3: Japanese Patent Application Laid-Open Publication No. 2014-123783
Patent Document 4: Japanese Patent Application Laid-Open Publication No. 2014-103152

SUMMARY OF THE INVENTION

Problems to be Solved by the Invention

When heat conduction in a semiconductor device having a multilayer wiring substrate is taken into consideration, it is effective to form a conductive pattern (for example, a heat dissipation pattern) having a large area in the lowermost wiring layer of the multilayer wiring substrate. In recent years, however, semiconductor chips with larger amount of heat generation are often mounted along with the improvement in performance of chips, and it is necessary to form a larger heat dissipation pattern in order to improve the heat dissipation.

Also, when a semiconductor device is mounted on a mother board (mounting board), for example, reflow is performed at about 250° C. to 260° C., but when the multilayer wiring substrate is heated to a high temperature by the reflow, gas (outgas) is generated from an insulating layer or the like inside the multilayer wiring substrate. Such a phenomenon will occur also at the time of heating in a test of post-process performed after assembly of the semiconductor device and when the mother board having a semiconductor device mounted thereon is used under a high-temperature environment. Also, in the case where a large heat dissipation pattern is provided in the lowermost wiring layer in the multilayer wiring substrate of the semiconductor device, the gas generated from the resin of the insulating layer or the like in the multilayer wiring substrate is difficult to escape to the outside from the lower layer side of the multilayer wiring substrate.

Accordingly, the inventors of the present application have found that the gas generated from the resin or the like of the multilayer wiring substrate is difficult to release to the outside of the semiconductor device due to the large heat dissipation pattern, and thus the pressure inside the multilayer wiring substrate locally increases and peeling of the wiring layer occurs between the wiring layer on the lower layer side with low adhesion and the insulating layer just below the wiring layer.

Further, when the above-mentioned peeling occurs, swelling occurs on the lower layer side of the multilayer wiring substrate, with the result that mounting defects occur when the semiconductor device is mounted on the mother board and the reliability of the semiconductor device is deteriorated.

Other problems and novel features will be apparent from the description of this specification and the accompanying drawings.

Means for Solving the Problems

A semiconductor device according to one embodiment include: a wiring substrate having a first insulating layer, a first protective film covering a first surface of the first insulating layer, a first wiring layer bonded with a second surface of the first insulating layer, a second insulating layer bonded with a first surface of the first wiring layer, a second wiring layer bonded with a first surface of the second insulating layer, and a second protective film covering a first surface of the second wiring layer; and a semiconductor chip fixed to a first surface of the first protective film. Also, a degree of flatness of a second surface of the first wiring layer is lower than a degree of flatness of the first surface of the first wiring layer, the first wiring layer includes a first pattern, the second wiring layer includes a first pattern and a plurality of second patterns, and the first pattern provided in the second wiring layer is arranged at a position overlapping the first pattern provided in the first wiring layer. Further, an area of the first pattern provided in the second wiring layer is larger than a total area of the plurality of second patterns provided in the second wiring layer in a plan view, and opening portions through which a part of the second insulating layer is exposed are formed in the first pattern provided in the second wiring layer.

In addition, another semiconductor device according to one embodiment includes: a wiring substrate having a first insulating layer, a first protective film located on a first surface side of the first insulating layer, a first wiring layer bonded with a second surface of the first insulating layer, a second insulating layer bonded with a first surface of the first wiring layer, a second wiring layer bonded with a first surface of the second insulating layer, and a second protective film covering a first surface of the second wiring layer. The semiconductor device further includes: a semiconductor chip mounted on a first surface of the first protective film; and a sealing body that seals the semiconductor chip and the first surface of the first protective film of the wiring substrate, a degree of flatness of a second surface of the first wiring layer is lower than a degree of flatness of the first surface of the first wiring layer, the first wiring layer includes a first pattern, and the second wiring layer includes a first pattern and a plurality of second patterns. Furthermore, the first pattern provided in the second wiring layer is arranged at a position overlapping the first pattern provided in the first wiring layer, a total area of the first pattern provided in the second wiring layer is larger than a total area of the plurality of second patterns provided in the second wiring layer, and opening portions through which a surface of the second insulating layer is exposed are formed in the first pattern provided in the second wiring layer.

Effects of the Invention

According to the above embodiment, the reliability of the semiconductor device can be improved.

BRIEF DESCRIPTIONS OF THE DRAWINGS

FIG. 1 is a plan view showing an example of a structure of a semiconductor device according to an embodiment;

FIG. 2 is a side view showing an example of the structure of the semiconductor device shown in FIG. 1;

FIG. 3 is a back view showing an example of the structure of the semiconductor device shown in FIG. 1;

FIG. 18 is a flow diagram and a cross-sectional view showing an example of a procedure for assembling the wiring substrate of the semiconductor device shown in FIG. 1;

FIG. 20 is a flow diagram and a cross-sectional view showing an example of the procedure for assembling the wiring substrate of the semiconductor device shown in FIG. 1;

DETAILED DESCRIPTION OF PREFERRED EMBODIMENTS

Figure 4:
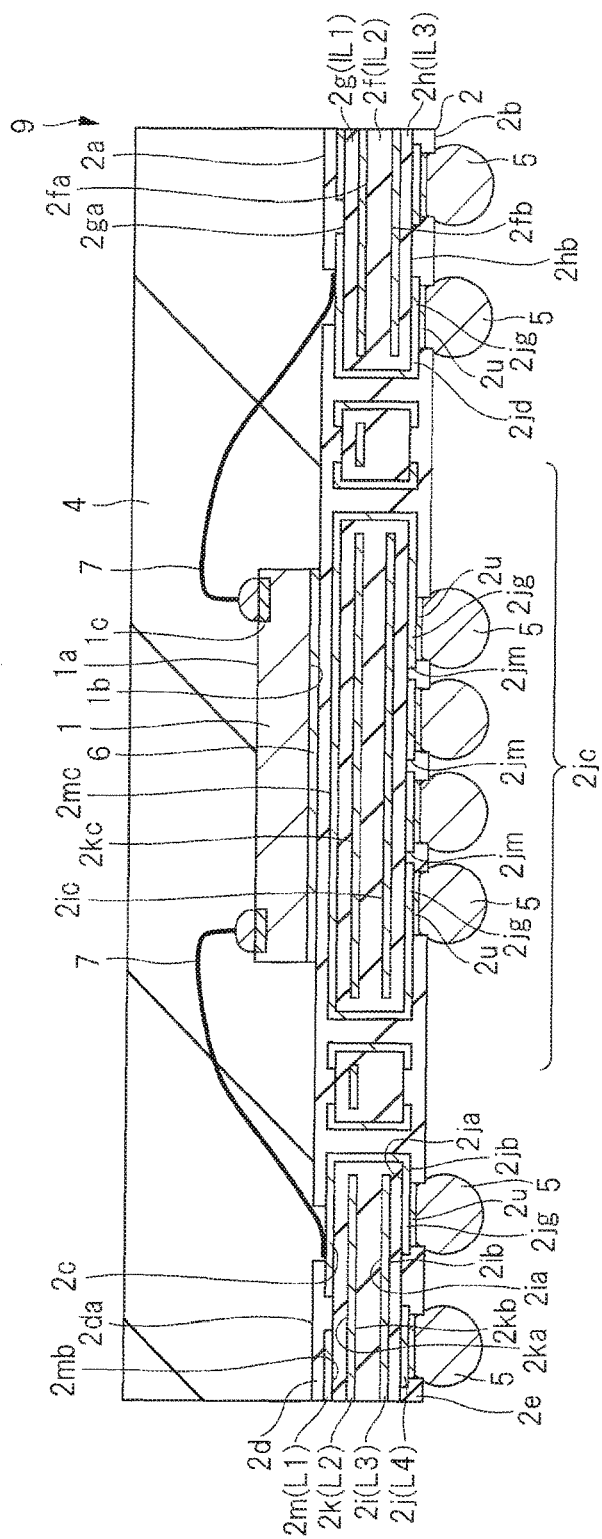
FIG. 4 is a cross-sectional view showing an example of the structure taken along line A-A shown in FIG. 3.

In the following embodiments, descriptions of the same or similar portions will not be repeated in principle unless particularly needed.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like are "made of A", "made up of A", "include A" or "contain A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, hatching is used even in a plan view so as to make the drawings easy to see.

<Semiconductor Device>

A semiconductor device according to the present embodiment shown in FIG. 1 to FIG. 4 is a resin-sealed semiconductor package in which a semiconductor chip 1 is mounted on an upper surface 2a of a wiring substrate 2 and this semiconductor chip 1 is sealed with a sealing body 4 made of resin. Further, the semiconductor chip 1 is electrically connected to bonding leads (electrodes) 2c of the wiring substrate 2 via wires (conductive members) 7, and a BGA 9 in which solder balls 5 which are a plurality of external terminals are provided on a lower surface 2b of the wiring substrate 2 will be described as an example of the semiconductor device in the present embodiment. However, the structure of the semiconductor device is not limited to the BGA, and may be LGA (Land Grid Array).

The detailed configuration of the BGA 9 according to the present embodiment will be described. The BGA 9 includes a wiring substrate (multilayer wiring substrate) 2 having four wiring layers, a semiconductor chip 1 mounted on an upper surface 2a of a solder resist film (first protective film) 2d of the wiring substrate 2 via a die bond material 6, and a plurality of solder balls 5 (external terminals) provided on a lower surface 2b of the wiring substrate 2.

The semiconductor chip 1 has a main surface 1a and a back surface 1b opposite to the main surface 1a, and a plurality of electrode pads 1c are formed along the periphery of the main surface 1a. Further, the semiconductor chip 1 is mounted (fixed) on the upper surface 2a of the wiring substrate 2 (upper surface 2da of the solder resist film 2d) via the die bond material (adhesive agent made of resin or the like) 6 so that the back surface 1b faces the wiring substrate 2.

The BGA 9 further includes a plurality of wires 7 that electrically connect a plurality of electrode pads 1c formed on the main surface 1a of the semiconductor chip 1 and a plurality of bonding leads 2c formed in a second wiring layer (first conductive layer L1) 2m of the wiring substrate 2 and a sealing body 4 that seals the semiconductor chip 1 and the upper surface 2a of the solder resist film 2d of the wiring substrate 2.

Figure 5:
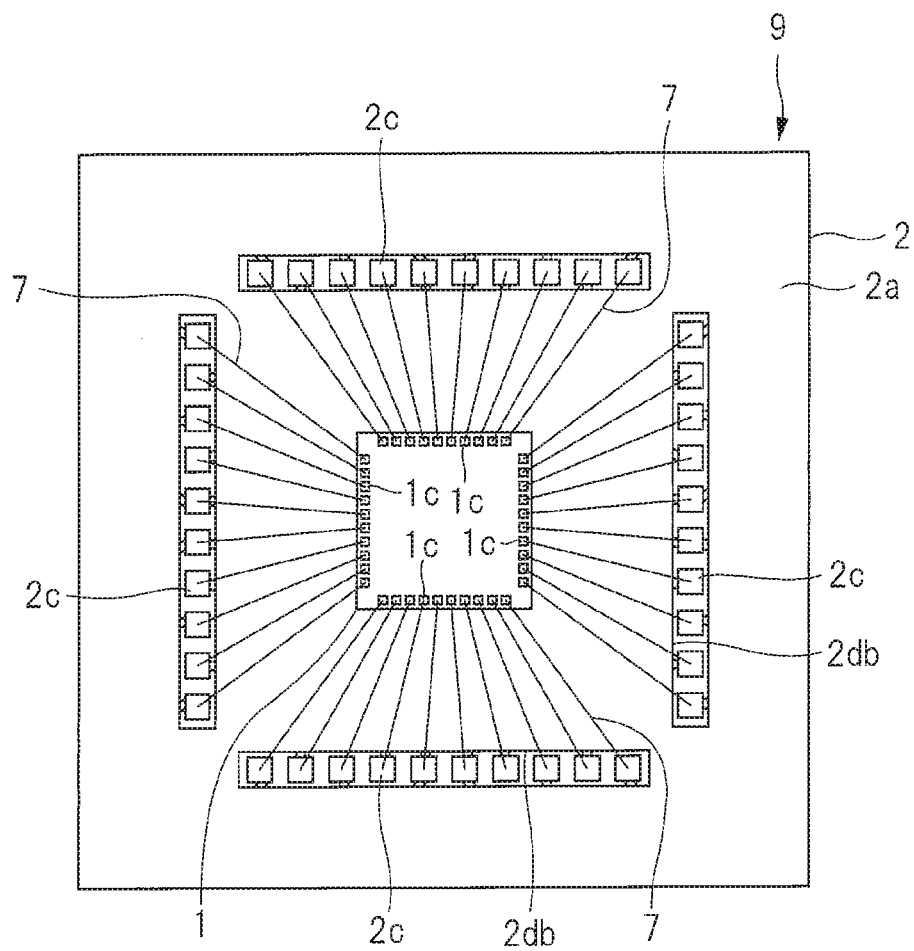
FIG. 5 is a plan view showing an example of a structure in which a sealing body of the semiconductor device shown in FIG. 1 is removed.

Note that, as shown in FIG. 5, four elongated resist openings 2db are formed along four sides of the semiconductor chip 1 on the solder resist film 2d on the upper surface 2a of the wiring substrate 2, and a plurality of bonding leads 2c are arranged in each of these resist openings 2db. Also, each of the plurality of bonding leads 2c exposed in the resist openings 2db and each of the plurality of electrode pads 1c formed in the periphery of the main surface 1a of the semiconductor chip 1 are electrically connected by the wires 7.

Also, in the BGA 9, the plurality of solder balls 5 are provided in a peripheral arrangement as shown in FIG. 3. However, the arrangement of the solder balls 5 is not limited to the peripheral arrangement, and may be a matrix arrangement or the like.

In this case, the semiconductor chip 1 is made of, for example, silicon, and the wire 7 is made of, for example, a gold wire or a copper wire. Further, the sealing resin forming the sealing body 4 is, for example, thermosetting epoxy resin.

Also, as shown in FIG. 4, the wiring substrate 2 is provided with a first insulating layer (second interlayer insulating layer IL2) 2f which is a core layer, a first wiring layer (second conductive layer L2) 2k bonded with (pasted to) an upper surface (first surface) 2fa of the first insulating layer 2f, a second insulating layer 2g bonded with (pasted to) an upper surface (first surface) 2ka of the first wiring layer 2*k*, and a second wiring layer 2*m* (L1) bonded with (pasted to) an upper surface (first surface) 2*ga* of the second insulating layer 2*g*.

Further, the wiring substrate 2 is provided with a solder resist film (first protective film) 2*d* that covers the upper surface 2*fa* of the first insulating layer 2*f*, a first wiring layer (third conductive layer L3) 2*i* bonded with (pasted to) a lower surface (second surface) 2*fb* of the first insulating layer 2*f* on the side opposite to the upper surface 2*fa*, and a second insulating layer 2*h* bonded with (pasted to) a lower surface (first surface) 2*ib* of the first wiring layer 2*i*.

Further, the wiring substrate 2 is provided with a second wiring layer (fourth conductive layer L4) 2*j* bonded with (pasted to) a lower surface (first surface) 2*hb* of the second insulating layer 2*h* and a solder resist film (second protective film) 2*e* that covers a lower surface (first surface) 2*jb* of the second wiring layer 2*j* and the lower surface 2*hb* of the second insulating layer (third interlayer insulating layer IL3) 2*h*.

Also, in the wiring substrate 2, the degree of flatness of an upper surface (second surface) 2*ia* on the side opposite to the lower surface 2*ib* of the first wiring layer 2*i* (L3) is lower than the degree of flatness of the lower surface 2*ib* of the first wiring layer 2*i* (L3). More specifically, the upper surface 2*ia* of the first wiring layer 2*i* (L3) is rougher than the lower surface 2*ib* of the first wiring layer 2*i* (L3). This is due to the copper foil forming process described below in which the surface of the copper foil is formed to be uneven.

Therefore, in the wiring substrate 2, the degree of adhesion between the first wiring layer 2*i* (L3) and the first insulating layer (core layer) 2*f* provided above the first wiring layer 2*i* (L3) is higher than the degree of adhesion between the first wiring layer 2*i* (L3) and the second insulating layer 2*h* below the first wiring layer 2*i* (L3).

Similarly, the degree of flatness of the lower surface 2*kb* of the first wiring layer 2*k* (L2) on the side opposite to the upper surface 2*ka* is lower than the degree of flatness of the upper surface 2*ka*. More specifically, the lower surface 2*kb* of the first wiring layer 2*k* (L2) is rougher than the upper surface 2*ka*. This is also due to the copper foil forming process described later in which the surface of the copper foil is formed to be uneven.

Therefore, in the wiring substrate 2, the degree of adhesion between the first wiring layer 2*k* (L2) and the first insulating layer (core layer) 2*f* provided below the first wiring layer 2*k* (L2) is higher than the degree of adhesion between the first wiring layer 2*k* (L2) and the second insulating layer (first interlayer insulating layer IL1) 2*g* above the first wiring layer 2*k* (L2).

Note that the insulating layers (the first insulating layer 2*f* which is the core layer and the second insulating layers 2*g* and 2*h*) in the wiring substrate 2 are made of, for example, a resin-based insulating material, and on the other hand, the wiring layers (the second wiring layer 2*m* (L1), the first wiring layer 2*k* (L2), the first wiring layer 2*i* (L3), and the second wiring layer 2*j* (L4)) are made of, for example, copper alloy.

Subsequently, the shape of the wiring pattern of each wiring layer in the wiring substrate (multilayer wiring substrate) 2 will be described.

Figure 6:
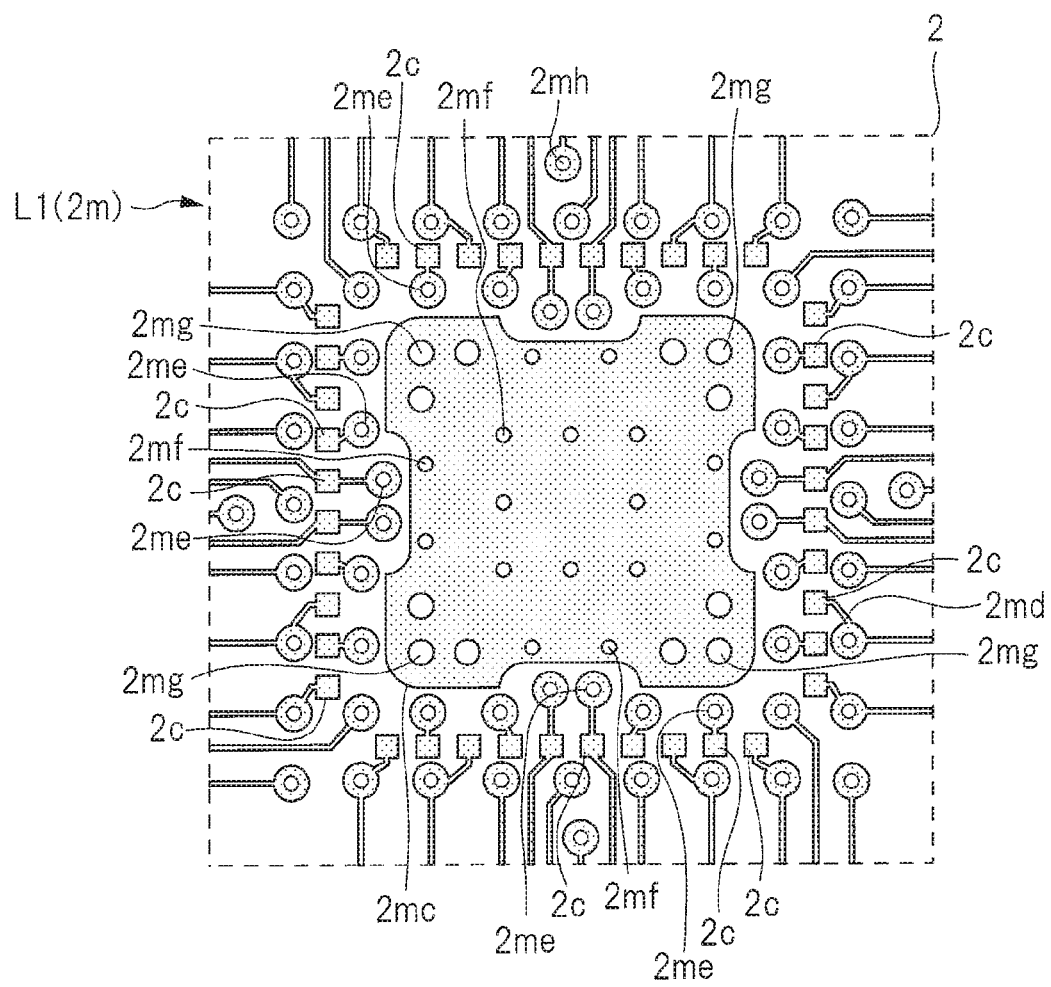
FIG. 6 is a plan view showing a wiring pattern of an uppermost wiring layer (L1) in the wiring substrate of the semiconductor device shown in FIG. 1.

The wiring layer shown in FIG. 6 is a wiring pattern (conductive pattern) of the second wiring layer 2*m* (L1) which is the uppermost wiring layer in the wiring substrate 2. A first pattern 2*mc* (first plane, first conductive pattern, first conductive plane) is formed substantially at the center of the second wiring layer 2*m*. The first pattern 2*mc* is formed in a substantially square shape in a plan view, and can be used (referred to) as, for example, a first heat dissipation pattern (first heat dissipation plane), a first power supply pattern (first power supply plane), a first GND pattern (first GND plane), or the like. Also, around the first pattern 2*mc*, a plurality of bonding leads (bonding pads) 2*c* are arranged side by side so as to form a substantially square shape. Further, the bonding leads 2*c* include those for signals and those for GND or power supply and the wiring 2*md* is connected to each of them, and the bonding leads 2*c* are electrically connected to other wiring layers via through holes (vias) 2*me*.

Also, a plurality of through holes 2*mf* are provided in a scattered manner in the first pattern 2*mc*. These through holes 2*mf* are electrically connected to the second wiring layer 2*j* (L4) which is the lowermost wiring layer shown in FIG. 9. Further, a plurality of opening portions 2*mg* for exposing parts of the upper surface (first surface) 2*ga* of the second insulating layer 2*g* are formed in the vicinity of the four corners of the peripheral portion of the substantially square first pattern 2*mc*. Further, since a part of the solder resist film 2*d* is formed in the opening portion 2*mg*, the adhesion between the first pattern 2*mc* and the solder resist film 2*d* is improved. The opening portion 2*mg* may be referred to also as a slit, a dent portion or the like. The planar shape of the opening portion 2*mg* shown in FIG. 6 is a circle, but the planar shape of the opening portion 2*mg* is not limited to the circle, and may be a square or the like.

Figure 7:
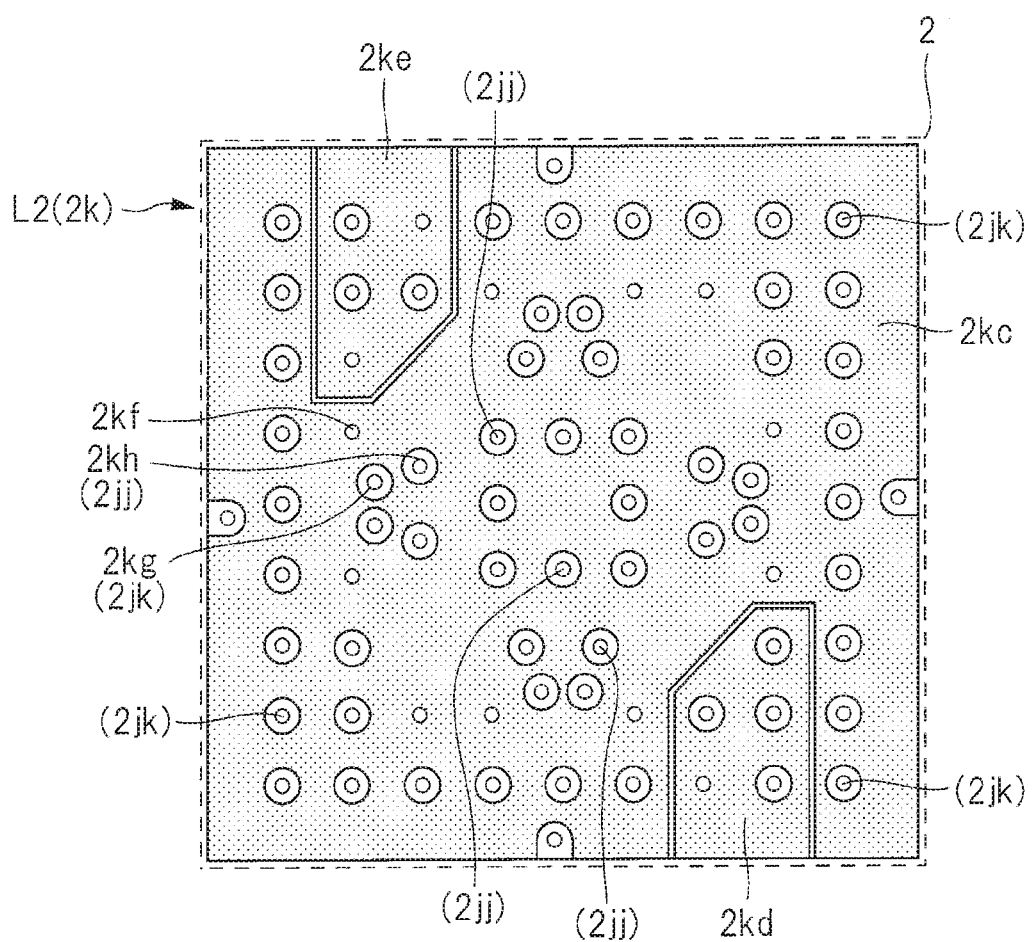
FIG. 7 is a plan view showing a wiring pattern of a second wiring layer (L2) from the top in the wiring substrate of the semiconductor device shown in FIG. 1.

The wiring layer shown in FIG. 7 is a wiring pattern of the first wiring layer 2*k* (L2) which is the second wiring layer from the top in the wiring substrate 2. The first wiring layer 2*k* is divided into three regions. A block that is located near the center and has the largest area is a first pattern 2*kc* (first plane, first conductive pattern, first conductive plane, first division plane), and can be used (referred to) as, for example, a first heat dissipation pattern (first heat dissipation plane), a first power supply pattern (first power supply plane), a first GND pattern (first GND plane), or the like.

Also, one of the patterns divided (electrically separated) from the first pattern 2*kc* is a second pattern 2*kd* (second plane, second conductive pattern, second conductive plane, second division plane), and the second pattern 2*kd* has an area much smaller than that of the first pattern 2*kc*. The second pattern 2*kd* can be used (referred to) as, for example, a second heat dissipation pattern (second heat dissipation plane), a second power supply pattern (second power supply plane), a second GND pattern (second GND plane), or the like. In addition, the other of the patterns divided (electrically separated) from the first pattern 2*kc* is a second pattern 2*ke* (or third pattern, third plane, third conductive pattern, third conductive plane, third division plane), and the second pattern 2*ke* is divided (electrically separated) also from the second pattern 2*kd*. For example, in addition to alternative expressions of the second pattern 2*kd* described above, the second pattern 2*ke* can be used (referred to) as a third heat dissipation pattern (third heat dissipation plane), a third power supply pattern (third power supply plane), a third GND pattern (third GND plane), or the like.

With respect to the division of the patterns described above, the patterns for the power supply/GND are divided into several functional blocks in many cases in order to avoid the influence caused by the noises generated from respective functional units, and as a result, the wiring pattern is divided into a plurality of patterns (even power supplies with the same potential may be separated depending on the supply destination). The first pattern 2*kc*, the second pattern 2*kd*, and the second pattern 2*ke* may all have different potentials. Further, for example, the pattern may be separated depending on the purposes in such a manner that the first pattern 2kc is used for GND/power supply for the core, the second pattern 2kd is used for GND/power supply for analog, and the second pattern 2ke is used for GND/power supply for IO.

Also, in the plurality of through holes formed in the first wiring layer 2k (L2), for example, a through hole 2kf is connected to the through hole 2me connected to the bonding lead 2c of the second wiring layer 2m (L1) in the first layer. Namely, the bonding lead 2c and the first pattern 2kc of the first wiring layer 2k are electrically connected to each other via the through hole 2kf. In addition, a through hole 2kg is connected to the through hole 2me connected to the bonding lead 2c of the second wiring layer 2m (L1) in the first layer, but is not connected to the first pattern 2kc of the first wiring layer 2k. Namely, the bonding lead 2c and the first pattern 2kc of the first wiring layer 2k are not electrically connected to each other via the through hole 2kg. In addition, a through hole 2kh is connected to the through hole 2mf connected to the first pattern 2mc in the first layer, but is not connected to the first pattern 2kc of the first wiring layer 2k. Namely, the first pattern 2mc in the first layer and the first pattern 2kc of the first wiring layer 2k are not electrically connected to each other via the through hole 2kh.

Figure 8:
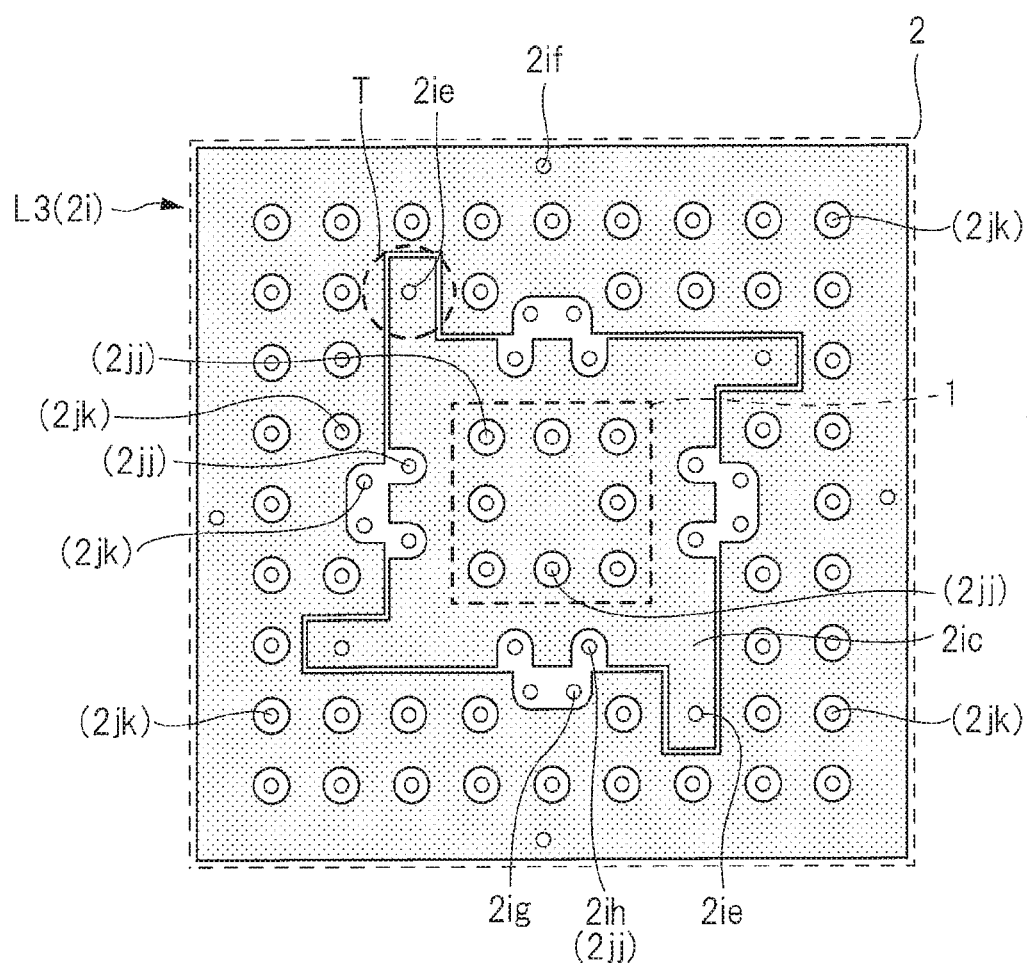
FIG. 8 is a plan view showing a wiring pattern of a third wiring layer (L3) from the top in the wiring substrate of the semiconductor device shown in FIG. 1.

The wiring layer shown in FIG. 8 is a wiring pattern of the first wiring layer 2i (L3) which is the third wiring layer from the top in the wiring substrate 2. The first wiring layer 2i is divided into two regions. The region located near the center is a first pattern 2ic (first plane, first conductive pattern, first conductive plane, first division plane), and can be used (referred to) as, for example, a first heat dissipation pattern (first heat dissipation plane), a first power supply pattern (first power supply plane), a first GND pattern (first GND plane), or the like. Also, a region divided from the first pattern 2ic is a second pattern 2id arranged around the first pattern 2ic. For example, the second pattern 2id (second plane, second conductive pattern, second conductive plane, second division plane) can be used (referred to) as a second heat dissipation pattern (second heat dissipation plane), a second power supply pattern (second power supply plane), a second GND pattern (second GND plane), or the like. The reason why the pattern of the first wiring layer 2i (L3) is divided is similar to the reason related to the first wiring layer 2k (L2) described above.

Also, in the plurality of through holes formed in the first wiring layer 2i (L3), for example, a through hole 2ie formed in the first pattern 2ic is connected to the through hole 2me connected to the bonding lead 2c of the second wiring layer 2m (L1) in the first layer. Namely, the bonding lead 2c and the first pattern 2ic of the first wiring layer 2i are electrically connected via the through hole 2ie. Also, a through hole 2ig is connected to the through hole 2me connected to the bonding lead 2c of the second wiring layer 2m (L1) in the first layer, but is not connected to the second pattern 2id of the first wiring layer 2i. Namely, the bonding lead 2c and the second pattern 2id of the first wiring layer 2i are not electrically connected to each other via the through hole 2ig. In addition, a through hole 2ih is connected to the through hole 2mf connected to the first pattern 2mc in the first layer, but is not connected to the first pattern 2ic of the first wiring layer 2i. Namely, the first pattern 2mc in the first layer and the first pattern 2ic of the first wiring layer 2i are not electrically connected to each other via the through hole 2ih. Also, a through hole 2if formed in the second pattern 2id of the first wiring layer 2i is connected to the through hole 2mh of the second wiring layer 2m (L1) in the first layer.

Note that the first pattern 2ic of the first wiring layer 2i is arranged at a position overlapping the semiconductor chip 1 in a cross-sectional view (FIG. 4) or a plan view (FIG. 8).

Figure 9:
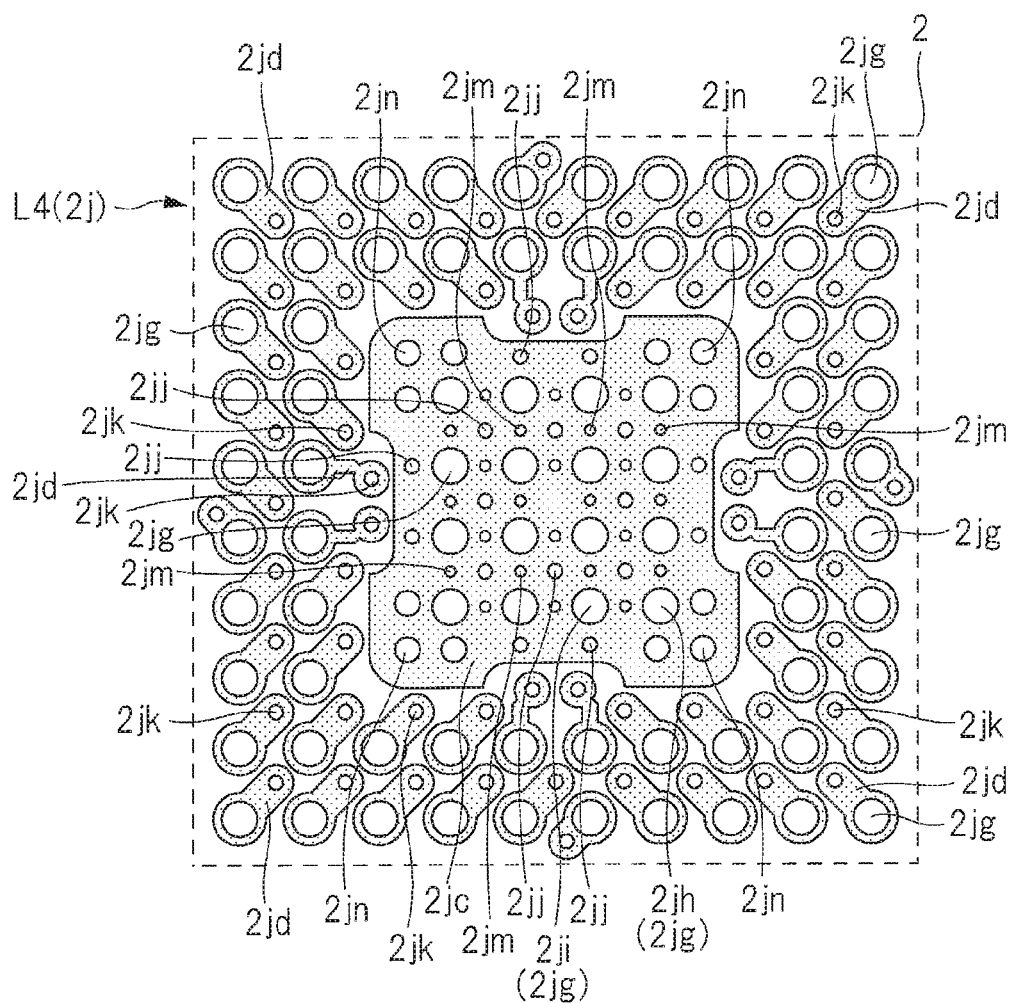
FIG. 9 is a plan view showing a wiring pattern of a lowermost wiring layer (L4) in the wiring substrate of the semiconductor device shown in FIG. 1.

The wiring layer shown in FIG. 9 is a wiring pattern of the second wiring layer 2j (L4) which is the lowermost wiring layer in the wiring substrate 2.

The second wiring layer 2j (L4) includes a first pattern 2jc (first plane, first conductive pattern, first conductive plane) arranged at a position overlapping the semiconductor chip 1 in a cross-sectional view (FIG. 4) or a plan view (FIG. 14 described later) and a plurality of second patterns 2jd (second conductive patterns) arranged around the first pattern 2jc.

Note that the first pattern 2jc can be used (referred to) as, for example, a first heat dissipation pattern (first heat dissipation plane), a first power supply pattern (first power supply plane), a first GND pattern (first GND plane), or the like. Also, the second pattern 2jd is referred to also as, for example, a signal pattern, a signal wiring, a power supply wiring, a GND wiring, or the like. Further, as shown in the cross-sectional view of FIG. 4, the first pattern 2jc of the second wiring layer 2j is arranged at the position overlapping the first pattern 2ic provided in the first wiring layer 2i (L3) in a transparent plan view. Also, an external diameter of the first pattern 2jc provided in the second wiring layer 2j (L4) is larger than external diameters of the plurality of (for example, two) second patterns 2jd provided in the second wiring layer 2j (L4) in a plan view (FIG. 9).

Furthermore, an area (or total area) of the first pattern 2jc provided in the second wiring layer 2j (L4) is larger than an area (or total area) of the plurality of (for example, two) second patterns 2jd provided in the second wiring layer 2j (L4) in a plan view.

Note that the plurality of second patterns 2jd are formed in two rows in the peripheral portion of the second wiring layer 2j, and are provided with a plurality of lands 2jg to which the solder balls 5 shown in FIG. 2 are connected. The land 2jg is referred to also as, for example, a ball land, an electrode pad, or an external electrode pad.

Also, in the plurality of through holes formed in the second wiring layer 2j (L4), for example, a through hole 2jj formed in the first pattern 2jc is connected to the through hole 2mf connected to the first pattern 2mc of the second wiring layer 2m (L1) in the first layer. Namely, the first pattern 2mc of the second wiring layer 2m and the first pattern 2jc of the second wiring layer 2j are electrically connected to each other via the through hole 2jj. Also, the through hole 2jj is not electrically connected to the first pattern 2kc of the first wiring layer 2k and the first pattern 2ic of the first wiring layer 2i.

In addition, the through hole 2jk connected to the second pattern 2jd of the second wiring layer 2j (L4) is electrically connected to other wiring layers (for example, the second wiring layer 2m (L1), the first wiring layer 2k (L2), and the first wiring layer 2i (L3)) via the through hole 2jk.

Further, a plurality of first opening portions (opening portions) 2jm for exposing parts (surface) of the lower surface 2hb of the second insulating layer 2h shown in FIG. 4 are formed in the first pattern 2jc provided in the second wiring layer 2j (L4). The first opening portion 2jm is referred to also as, for example, a first gas vent hole, a first slit portion, a first dent portion, or the like, and the planar shape thereof is a circle, but the planar shape thereof is not limited to the circle, and may be a square, a slit, or the like.

In addition, a plurality of second opening portions 2jn for exposing parts (surface) of the lower surface 2hb of the second insulating layer 2h are provided outside the region where the plurality of first opening portions 2*jm* of the first pattern 2*jc* of the second wiring layer 2*j* (L4) are provided. Like the first opening portion 2*jm*, the second opening portion 2*jn* is referred to also as, for example, a second gas vent hole, a second slit portion, a second dent portion, or the like, and the planar shape thereof is a circle, but the planar shape thereof is not limited to the circle, and may be a square, a slit, or the like. In the example shown in FIG. 9, three second opening portions 2*jn* are provided in the vicinity of each of the four corner portions of the peripheral portion of the substantially square first pattern 2*jc*. However, the number of second opening portions 2*jn* is not limited to the number described above.

Also, the first pattern 2*jc* provided in the second wiring layer 2*j* (L4) is arranged to overlap the first pattern 2*ic* of the first wiring layer 2*i* (L3) in a transparent plan view. Further, the first pattern 2*jc* provided in the second wiring layer 2*j* (L4) is arranged inside the first pattern 2*ic* of the first wiring layer 2*i* (L3).

Thus, the first pattern 2*ic* of the first wiring layer 2*i* (L3) is provided in the upper layer of the first pattern 2*jc* in the center portion of the lowermost layer (L4), and as indicated by T portion of FIG. 8, four extended regions, in which the through hole 2*ie* for connecting to the bonding lead 2*c* of the second wiring layer 2*m* (L1) is arranged, are provided in the first pattern 2*ic* of the first wiring layer 2*i* (L3). Accordingly, the first pattern 2*jc* of the second wiring layer 2*j* (L4) is arranged inside the first pattern 2*ic* of the first wiring layer 2*i* (L3).

Also, the first pattern 2*jc* of the second wiring layer 2*j* (L4) includes a plurality of first lands 2*jh* and second lands 2*ji* exposed from the solder resist film (second protective film) 2*e* shown in FIG. 4, and the plurality of solder balls 5 shown in FIG. 4 are mounted on the first lands 2*jh* and the second lands 2*ji*. Since the first pattern 2*jc* of the second wiring layer 2*j* (L4) is not electrically connected to the semiconductor chip 1, the plurality of solder balls 5 mounted on the first lands 2*jh* and the second lands 2*ji* are solder balls for heat dissipation that are not electrically connected to the semiconductor chip 1.

On the other hand, the plurality of second patterns 2*jd* in the second wiring layer 2*j* have a plurality of lands 2*jg* exposed from the solder resist film 2*e*, and the plurality of solder balls 5 are mounted as external terminals on the plurality of lands 2*jg*.

Figure 10:
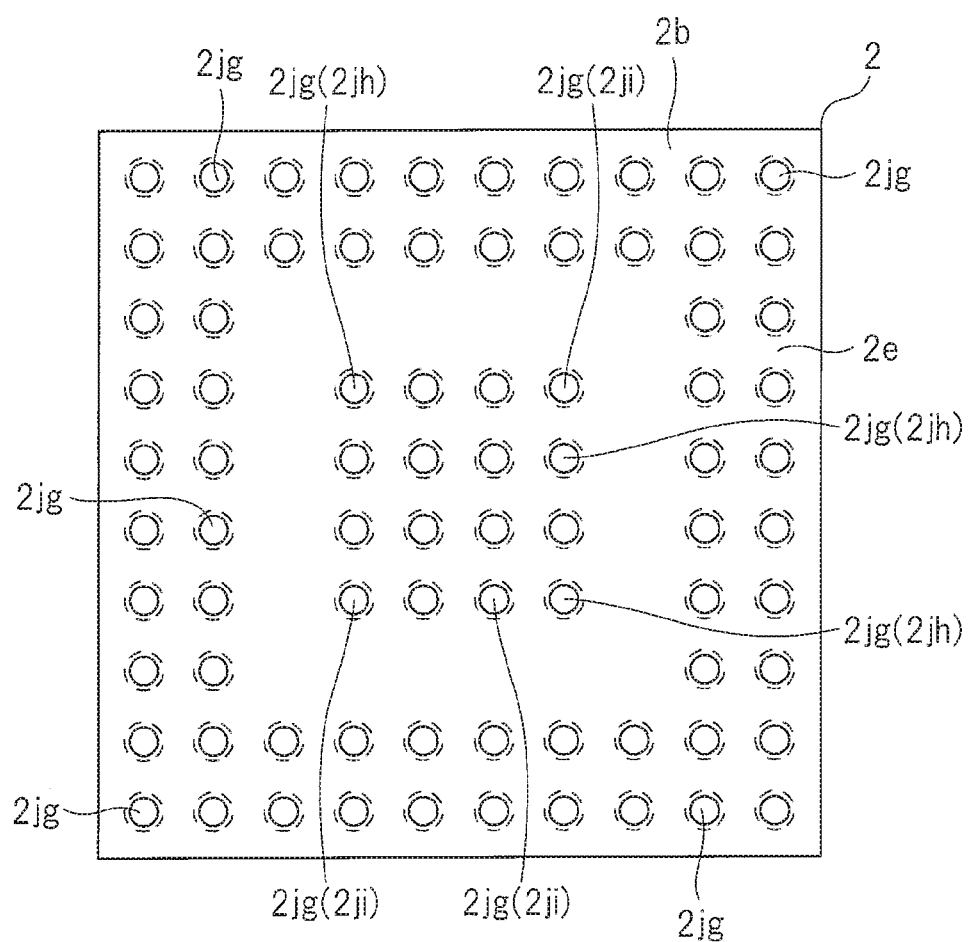
FIG. 10 is a back view showing an example of a structure of a back surface (lower surface) of the wiring substrate of the semiconductor device shown in FIG. 1.

FIG. 10 shows an example of arrangement of the lands 2*jg* on the back surface (lower surface 2*b*) of the wiring substrate 2.

In the central portion of the lower surface 2*b* of the wiring substrate 2, the first lands 2*jh* and the second lands 2*ji* to which the solder balls 5 for heat dissipation (referred to also as thermal balls) are connected are exposed. Also, the plurality of lands 2*jg* to which the solder balls 5 serving as external terminals are connected are exposed and arranged in two rows along the peripheral portion of the lower surface 2*b*.

Note that the peripheral portion of each of the plurality of lands 2*jg*, the plurality of first lands 2*jh*, and the plurality of second lands 2*ji* is covered with the solder resist film (second protective film) 2*e*, and has an SMD (Solder Mask Defined) structure.

Figure 11:
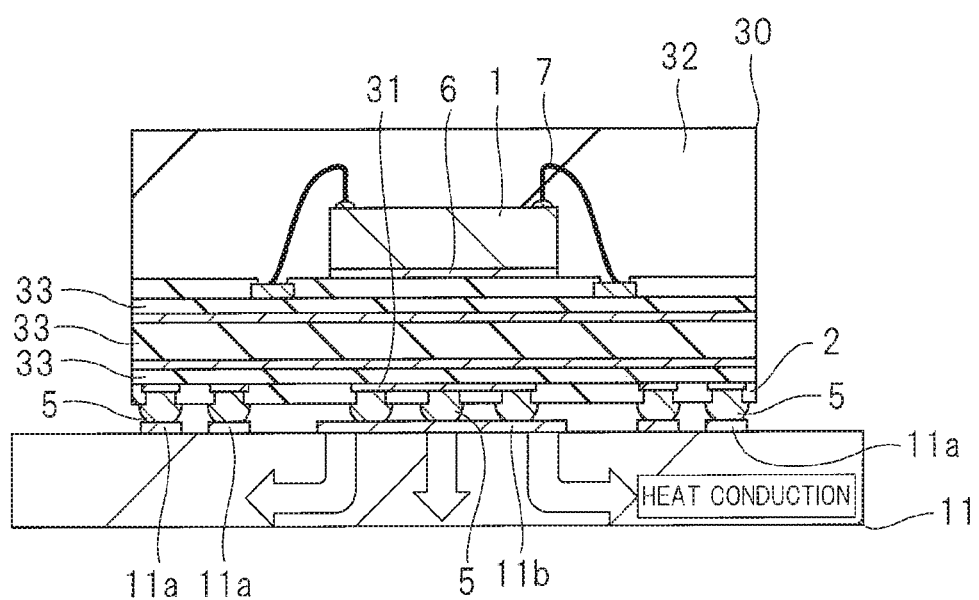
FIG. 11 is a cross-sectional view showing a heat conduction state in a mounting structure of a semiconductor device according to an examination example.
Figure 12:
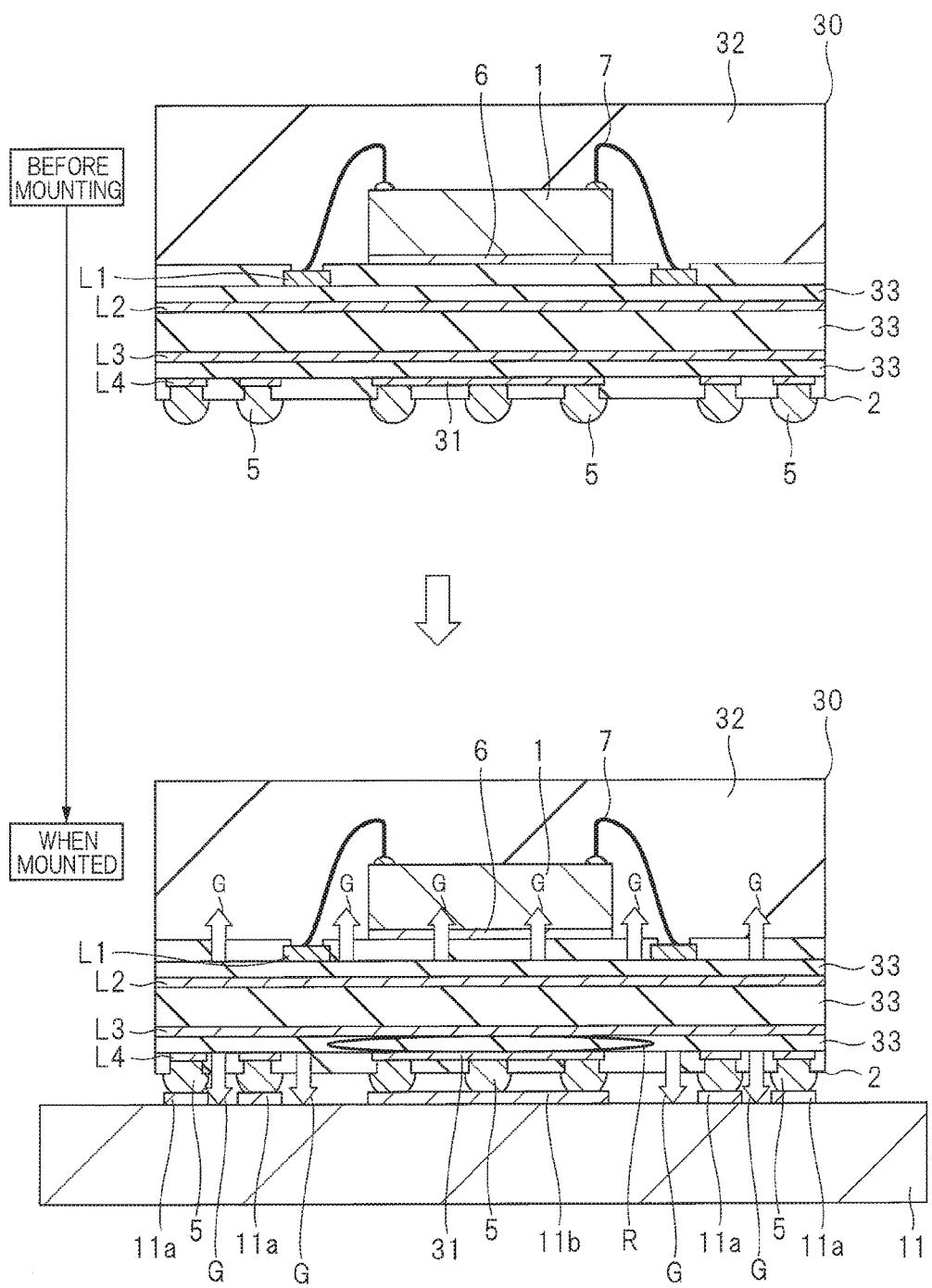
FIG. 12 is a cross-sectional view showing a structure before and after mounting the semiconductor device according to the examination example.
Figure 13:
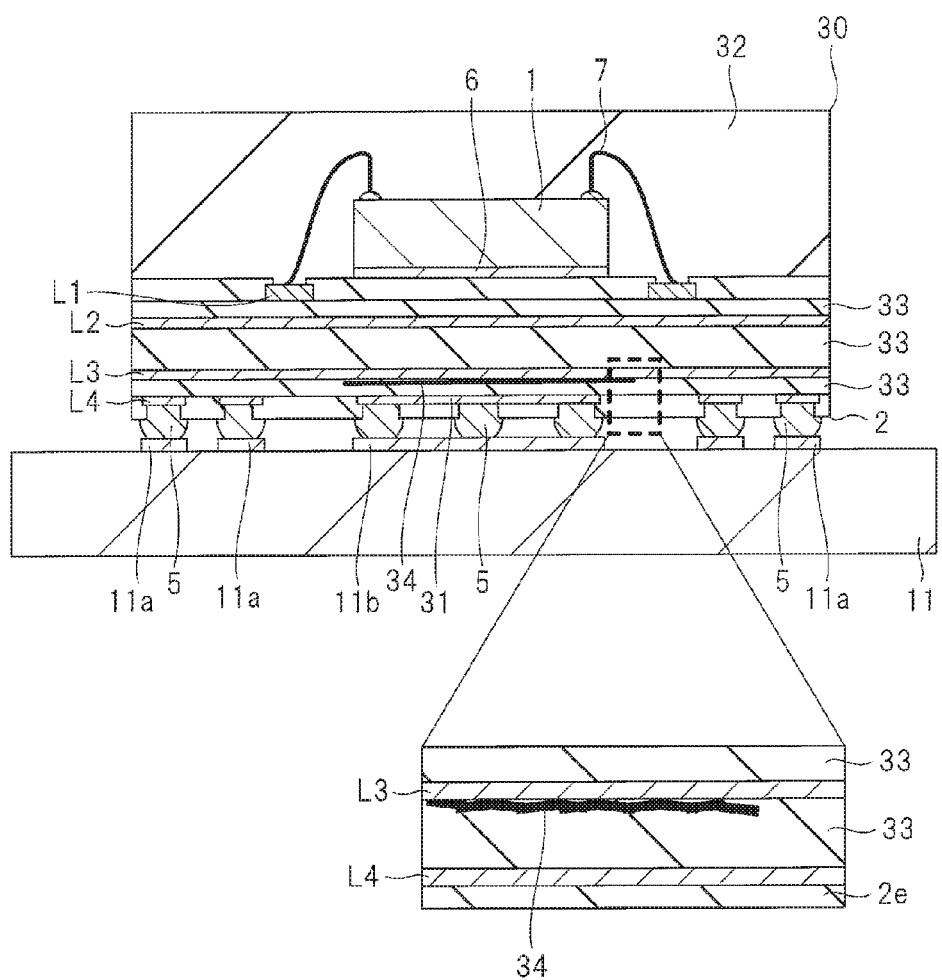
FIG. 13 is a cross-sectional view and a partially enlarged cross-sectional view showing the mounting structure of the semiconductor device according to the examination example.

Subsequently, the details of the problems to be solved by the invention of the present application will be described with reference to an examination example considered by the inventors of the present application. FIG. 11 is a cross-sectional view showing a heat conduction state in a mounting structure of a semiconductor device according to an examination example, FIG. 12 is a cross-sectional view showing a structure before and after mounting the semiconductor device according to the examination example, and FIG. 13 is a cross-sectional view and a partially enlarged cross-sectional view showing the mounting structure of the semiconductor device according to the examination example.

As shown in FIG. 11, when a heat conduction in a BGA 30 having the wiring substrate (multilayer wiring substrate) 2 is taken into consideration, it is effective to form a heat dissipation pattern 31 having a large area in a lowermost wiring layer of the wiring substrate 2. However, the semiconductor chip 1 with larger amount of heat generation is often mounted along with the improvement in performance of semiconductor chip 1, and it is necessary to form a larger heat dissipation pattern 31 in order to improve the heat dissipation.

Note that, since the heat dissipation pattern 31 is provided with a plurality of thermal balls (solder balls 5) for the purpose of heat dissipation, it has been considered that it is not preferable to form an opening that blocks the heat dissipation path between these balls (it has been considered that it is preferable to perform heat dissipation as uniformly as possible in the heat dissipation pattern 31). In addition, from the viewpoint of electrical characteristics, the large wiring pattern of the lowermost layer (outermost layer) is provided with an aim to enhance the shielding effect, and therefore, it has been considered that it is not preferable to provide a plurality of openings in the large wiring pattern for the improvement of the electrical characteristics.

However, as described above, the semiconductor chip 1 with larger amount of heat generation is often mounted along with the improvement in performance of semiconductor chip 1, and it is necessary to form the larger heat dissipation pattern 31 in order to improve the heat dissipation and the electrical characteristics.

Here, in the BGA 30 provided with the wiring substrate 2 having four wiring layers (L1, L2, L3, L4) as shown in FIG. 12, for example, the wiring substrate 2 is also heated to a high temperature when the BGA 30 is heated by reflow or the like at the time of mounting on the mother board (mounting board) 11. When the wiring substrate (multilayer wiring substrate) 2 is heated to a high temperature, the internal pressure rises at the R portion inside the substrate, and gas G is generated from the insulating layer or the like (the gas G shown in FIG. 12 is out gas generated from the base material at a high temperature, and arrows G indicate dehumidification paths of the gas). Also, when the heat dissipation pattern (heat dissipation plane) 31 is provided in the central portion of the lowermost wiring layer in the wiring substrate 2 of the BGA 30 and the plurality of solder balls 5 for heat dissipation are provided in this heat dissipation pattern 31, the gas generated from the substrate is difficult to escape to the outside from the lower layer side.

More specifically, in the BGA 30 described above, the semiconductor chip 1 is mounted in the central portion on the upper side of the substrate and a mold resin 32 is disposed so as to cover the semiconductor chip 1. Therefore, even if an internal pressure is applied in the upward direction inside the substrate, the strength of the wiring substrate 2 is high and the upper layer side of the wiring substrate 2 is difficult to deform because the semiconductor chip 1 and the mold resin 32 are provided. In other words, among the four wiring layers, the wiring layers L3 and L4 are easier to deform than the wiring layers L1 and L2.

Further, since the uppermost wiring layer has more openings than other wiring layers, the gas G is easy to release upward. On the other hand, in the lowermost wiring layer, the area of the heat dissipation pattern 31 tends to increase for the purpose of improving the heat dissipation property and the electric characteristics such as the shielding effect described above, and therefore, the gas G is difficult to release from the lower layer side.

Thus, according to the study on the state of the heated wiring substrate (multilayer wiring substrate) 2 by the inventors of the present application, the gas G generated from the heated substrate, resin, and the like is difficult to release from the central portion of the substrate, and therefore, the pressure inside the substrate increases locally. As a result, the inventors of the present application have found that a peeling (crack) 34 of the wiring layer L3 occurs between the wiring layer L3 on the lower surface side and the insulating layer 33 immediately below the wiring layer L3 as shown in the enlarged cross-sectional view of FIG. 13.

Then, when the above peeling 34 occurs, swelling occurs in the central portion on the lower surface side of the wiring substrate 2, and as a result, mounting failure occurs when the BGA (semiconductor device) 30 is mounted on the mother board 11 and the reliability of the BGA 30 is deteriorated.

Note that the above-mentioned problem occurs also at the time of heating or the like in the test of the post-process performed after the assembly of the semiconductor device (BGA 30).

Also, in a method of forming the multilayer wiring substrate (wiring substrate 2) described later, first, copper foils are bonded with the front and back surfaces of an insulating layer such as the core layer. At that time, the surface of the copper foil having a high degree of roughness is bonded with the insulating layer. This is because the uneven surface of the copper foil is bonded with the insulating layer in order to improve the adhesion between the copper foil and the insulating layer. More specifically, when the copper foil is bonded with the insulating layer, pressure is applied to both after the copper foil is attached to the insulating layer. For example, when the wiring layer L3 is bonded with the insulating layer (for example, core) on the wiring layer L3, the one surface (side to be pasted) of the copper foil is an uneven surface formed by the crystal growth of copper through electrolytic reaction. The uneven surface of the copper foil and the insulating layer have a high degree of adhesion, but the surface of the copper foil on the opposite side has a high degree of flatness and a low degree of adhesion to the resin layer. As a result, the inventors of the present application have found that the peeling 34 is likely to occur between the wiring layer L3 of the wiring substrate 2 having four wiring layers and the insulating layer (insulating layer on the side opposite to the core side) 33 immediately below the wiring layer L3.

In the multilayer wiring substrate (wiring substrate) having two wiring layers, the surfaces of the copper foils having a high degree of roughness are bonded with both sides of the insulating layer. Therefore, since the degree of adhesion between the copper foil (wiring layer) and the insulating layer is high, the peeling is less likely to occur between the wiring layer and the insulating layer.

Next, a countermeasure to the above-mentioned problem in the wiring substrate 2 according to the present embodiment will be described.

Figure 14:
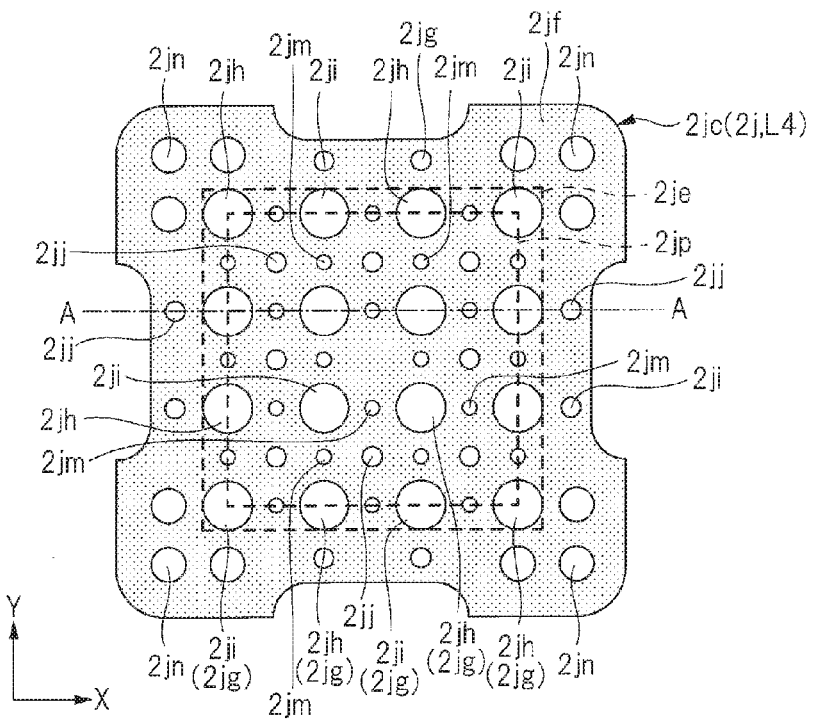
FIG. 14 is a partial plan view showing a wiring pattern of the lowermost wiring layer (L4) in the wiring substrate of the semiconductor device shown in FIG. 1.
Figure 15:
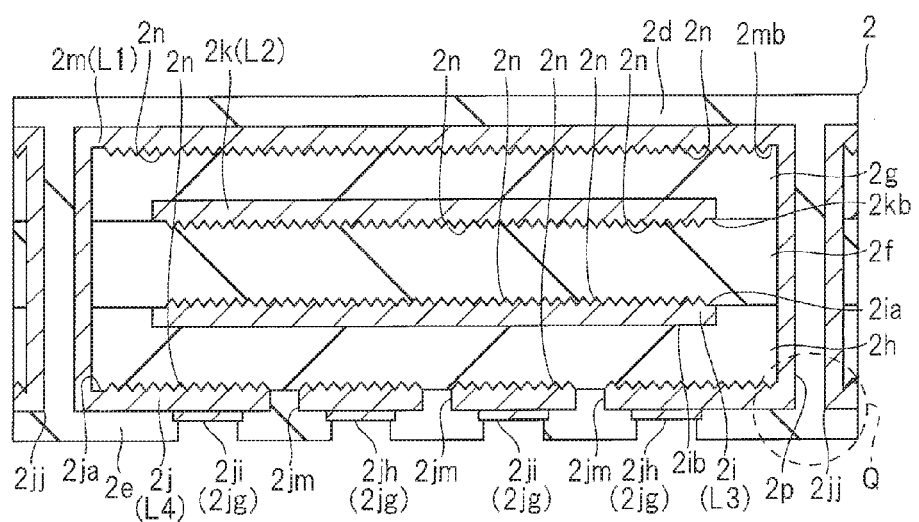
FIG. 15 is a cross-sectional view showing an example of the structure taken along line A-A in FIG. 14.

FIG. 14 is a plan view showing the first pattern 2jc in the central portion of the second wiring layer 2j (L4) in the lowermost layer of the wiring substrate (multilayer wiring substrate) 2 of the BGA 9 according to the present embodiment, and FIG. 15 shows a cross section taken along A-A in FIG. 14.

As shown in FIG. 14, the area of the first pattern 2jc provided in the second wiring layer 2j is larger than the area of the semiconductor chip 1 shown in FIG. 4 in a plan view. In other words, the area of the first pattern 2jc is larger than the area of the chip mounting region (chip region, third region) 2jp.

Also, in the transparent plan view, the semiconductor chip 1 is located inside the first pattern 2jc provided in the second wiring layer 2j.

Also, the plurality of first opening portions 2jm are formed in this first pattern 2jc. In the first pattern 2jc, the first lands 2jh and the second lands 2ji which are a plurality of lands for heat dissipation and arranged to be adjacent to each other are formed, and the solder balls 5 shown in FIG. 4 are connected to the first lands 2jh and the second lands 2ji, and the heat dissipation is performed through the solder balls 5.

In addition, the plurality of first opening portions 2jm are provided in a first region (land region, thermal ball region) 2je in which the first lands 2jh and the second lands 2ji are provided.

Further, the plurality of second opening portions 2jn are formed in a second region (region outside the land region, land-outside region) 2jf located outside the first region 2je.

Note that the first opening portion 2jm is formed between the first land 2jh and the second land 2ji as shown in FIG. 14 and FIG. 15.

Also, as shown in FIG. 15, unevenness 2n is formed on the lower surface 2mb of the second wiring layer 2m (L1), the lower surface 2kb of the first wiring layer 2k (L2), the upper surface 2ia of the first wiring layer 2i (L3), and the upper surface 2ja of the second wiring layer 2j (L4), and the degree of flatness is low. This is due to the copper foil forming process described later, and as a result, the surfaces of wiring layers each having the unevenness 2n formed thereon have high degree of adhesion with the insulating layers in contact with these surfaces.

More specifically, in each wiring layer, when the surface having the unevenness 2n (surface with a lower degree of flatness) and the surface on the side opposite thereto (surface with a higher degree of flatness) are compared, the surface having the unevenness 2n has a higher degree of adhesion with the insulating layer. For example, in the first wiring layer 2i (L3), the upper surface 2ia thereof has the unevenness 2n while the lower surface 2ib thereof has almost no unevenness 2n, and thus, the upper surface 2ia has a higher degree of adhesion with the insulating layer than the lower surface 2ib. More specifically, when the upper surface 2ia and the lower surface 2ib in the first wiring layer 2i (L3) are compared, the lower surface 2ib is easier to peel off from the insulating layer.

Figure 16:
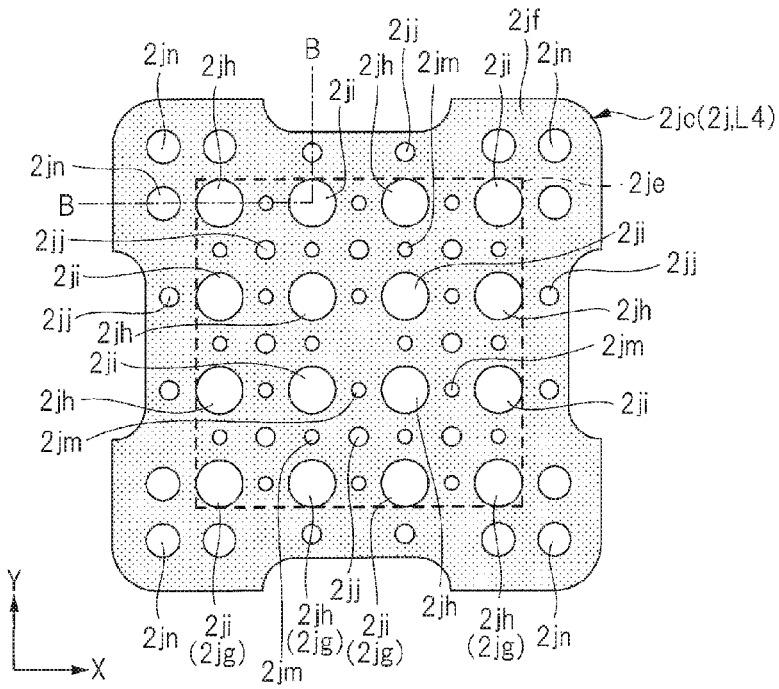
FIG. 16 is a partial plan view showing the wiring pattern of the lowermost wiring layer (L4) in the wiring substrate of the semiconductor device shown in FIG. 1.
Figure 17:
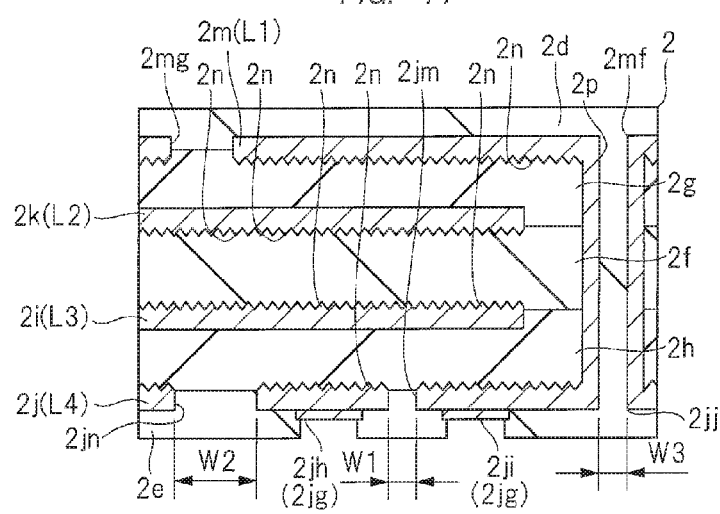
FIG. 17 is a cross-sectional view showing an example of the structure taken along line B-B in FIG. 16.

Also, FIG. 16 is a plan view showing the first pattern 2jc in the central portion of the second wiring layer 2j (L4) in the lowermost layer of the wiring substrate (multilayer wiring substrate) 2 of the BGA 9 according to the present embodiment, and FIG. 17 shows a cross section taken along B-B in FIG. 16.

As shown in FIG. 16, the first pattern 2jc of the second wiring layer 2j (L4) has a first region 2je in which a plurality of lands 2jg are formed and a second region 2jf located outside (around) the first region 2je. Then, as the opening portions through which gas can be released in the first pattern 2jc, the first opening portions 2jm and the second opening portions 2jn different from the first opening portions 2jm are provided, and the first opening portions 2jm are arranged in the first region 2je and the second opening portions 2jn are arranged in the second region 2jf outside the first region 2je. Namely, the parts (surface) of the lower surface 2hb of the second insulating layer 2h are exposed by the first opening portions 2jm and the second opening portions 2jn, and the gas generated from resin or the like of the insulating layer is easy to release to the outside of the semiconductor device. Note that the width of the first opening portion 2jm in a plan view is narrower than the width of the second opening portion 2jn. More specifically, in a plan view (FIG. 16) and a cross-sectional view (FIG. 17), the size of the first opening portion 2jm (W1 of FIG. 17) is smaller than the size of the second opening portion 2jn (W2 of FIG. 17) (W1<W2). In other words, since the interval of pitch between the first land 2jh and the second land 2ji is narrow, the width of the first opening portion 2jm is narrow.

Since the size of the second opening portion 2jn is larger than that of the first opening portion 2jm, the degree of adhesion with the solder resist film 2e can be increased. Note that the size (W1) of the first opening portion 2jm is approximately the same as or slightly smaller than the size (W3) of the through hole 2jj.

In addition, a plurality of lands 2jg are formed in the first region 2je of the first pattern 2jc of the second wiring layer 2j (L4). These lands 2jg (the first lands 2jh, the second lands 2ji) are lands for mounting the thermal balls (solder balls 5). Since the plurality of lands 2jg (the first lands 2jh, the second lands 2ji) are formed in the first region 2je as described above, it is preferable that the first opening portions 2jm are arranged between the lands.

More specifically, as shown in FIG. 16, the first lands 2jh and the second lands 2ji are arranged in a matrix form in the first region 2je. Further, the through holes 2jj are provided between the first lands 2jh and between the second lands 2ji arranged in an oblique direction. Therefore, it is effective that the first opening portions 2jm with reduced size in a plan view are provided between the first lands 2jh and the second lands 2ji (between the balls arranged in the matrix form in the vertical and horizontal directions), so that the plurality of first opening portions 2jm can be arranged in the first region 2je.

In other words, when the horizontal direction of the first pattern 2jc is defined as the X direction and the vertical direction of the first pattern 2jc is defined as the Y direction, the plurality of first opening portions 2jm are arranged in the horizontal direction (X direction) or the vertical direction (Y direction) in a plan view.

On the other hand, the second opening portions 2jn are formed in the second region 2jf, which is the region outside (around) the first region 2je. At this time, since the lands 2jg are not arranged and only a predetermined number of through holes 2jj are formed in the second region 2jf, the plurality of second opening portions 2jn having a larger opening area than the first opening portion 2jm can be arranged in the second region 2jf.

As described above, in the wiring substrate 2 according to the present embodiment, the plurality of first opening portions 2jm are formed in the first region 2je of the first pattern 2jc in the central portion of the second wiring layer 2j (L4) in the lowermost layer, and therefore, the gas (out gas) generated inside the substrate can be released to the outside from near the central portion on the lower surface side of the substrate. Also, since the plurality of second opening portions 2jn are formed in the second region 2jf outside the first region 2je, the out gas generated within the substrate can be released more from the lower surface side of the substrate to the outside through the first opening portions 2jm and the second opening portions 2jn.

Accordingly, even when the wiring substrate 2 is heated in the reflow mounting of the BGA 9 or in the test after assembling and the out gas is generated inside the substrate, the out gas can be released from the lower surface side of the substrate through the first opening portions 2jm and the second opening portions 2jn.

Therefore, it is possible to suppress the local increase of the pressure inside the substrate, and as a result, the occurrence of the peeling (crack) 34 of the wiring layer L3 between the wiring layer L3 on the lower surface side and the insulating layer 33 immediately below the wiring layer L3 shown in FIG. 13 can be prevented.

Thus, the reliability of the BGA 9 can be improved.

Note that the portion where the first opening portions 2jm are arranged is not limited to the position between the first land 2jh and the second land 2ji. For example, when there is a vacant space between the first lands 2jh and between the second lands 2ji arranged in the oblique direction in the first region 2je, the first opening portion 2jm may be arranged in that vacant space.

Further, regarding the sizes of the openings of the first opening portion 2jm and the second opening portion 2jn, the size of the opening of the first opening portion 2jm may not be necessarily smaller than the size of the opening of the second opening portion 2jn. For example, when there is a vacant space for providing the first opening portion 2jm having a larger opening than the second opening portion 2jn in the first region 2je, the first opening portion 2jm having the larger opening may be of course provided in the first region 2je. Also, the first opening portion 2jm and the second opening portion 2jn may have the same size. More specifically, there may be various relationships between the size of the first opening portion 2jm and the size of the second opening portion 2jn.

Note that the first opening portion 2jm and the second opening portion 2jn are openings that expose the surface or the inside of the second insulating layer 2h in the upper layer of these opening portions and the out gas generated within the substrate can be released from the openings, but the first opening portion 2jm and the second opening portion 2jn have structures different from an ordinary through hole. For example, since the through hole 2jj shown in the Q portion of FIG. 15 is a through hole wiring that electrically connects the wiring pattern of the lowermost layer and the wiring pattern of the uppermost layer, a conductive pattern 2p is formed on the inner wall surface of the hole, and the through hole 2jj is not an opening that exposes the surface or the inside of the second insulating layer 2h. More specifically, since the second insulating layer 2h is surrounded by the conductive pattern 2p, the out gas generated in the second insulating layer 2h and the like cannot be released to the outside of the substrate through the through hole 2jj.

However, a hole (including a dent, a slit, or the like) that does not have the conductive pattern 2p formed on the inner wall and can expose the surface or the inside of the insulating layer unlike an ordinary through hole may be provided as an opening portion of the present embodiment.

<Manufacturing Method of Wiring Substrate>

Figure 19:
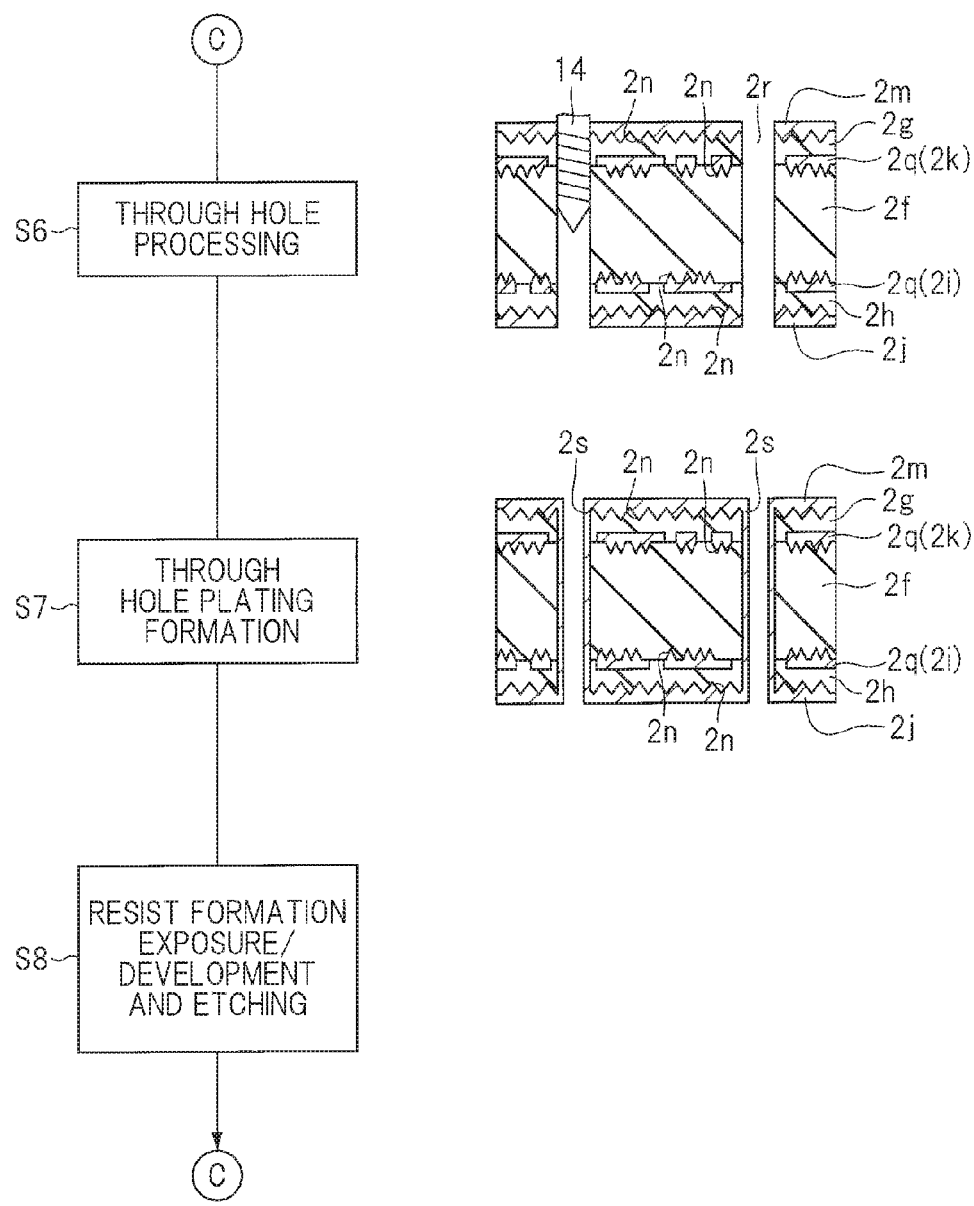
FIG. 19 is a flow diagram and a cross-sectional view showing an example of the procedure for assembling the wiring substrate of the semiconductor device shown in FIG. 1.

A manufacturing method of the wiring substrate 2 having four wiring layers will be described with reference to FIG. 18 to FIG. 20. FIG. 18, FIG. 19, and FIG. 20 are flow diagrams and cross-sectional views showing an example of a procedure for assembling the wiring substrate of the semiconductor device shown in FIG. 1.

First, copper foil formation shown in step S1 of FIG. 18 is performed. In this case, for example, a copper foil is formed by electrolytic copper foil manufacturing method.

More specifically, an electrolytic copper foil 2*q* is formed on a drum electrode (cathode) 13 by using copper sulfate solution 12. In the electrolytic copper foil manufacturing method, copper is deposited on the surface of a drum-shaped cathode (drum electrode 13) by electrolytic reaction of the copper sulfate solution 12, and the deposited copper is wound up when it reaches a desired thickness to manufacture the copper foil. At this time, a smooth surface (surface whose degree of flatness is high) appears on the drum side of the copper foil, but large unevenness 2*n* appears on the outer side (copper sulfate solution side) along with the growth of copper foil and the surface is made to be rough (the degree of flatness is low).

After the formation of the copper foil, copper-clad laminate formation shown in step S2 is performed. In this case, the copper foil (electrolytic copper foil 2*q*) is pasted on the upper and lower surfaces of the first insulating layer 2*f* which is the insulating layer serving as the core layer in such a manner that the surface of each copper foil having the high degree of roughness faces the insulating layer.

After the copper-clad laminate formation, a resist formation (exposure/development) shown in step S3 is performed. More specifically, a desired pattern is exposed and developed on the copper foil (electrolytic copper foil 2*q*) with using a resist film as a mask.

After the resist formation, etching shown in step S4 is performed. More specifically, the copper foil (electrolytic copper foil 2*q*) is etched to form a desired pattern on the copper foil (electrolytic copper foil 2*q*).

After the etching, lamination shown in step S5 is performed. More specifically, the second insulating layer 2*g* and the second insulating layer 2*h* are pasted by applying pressure by a block 22 to the upper and lower surfaces of the first insulating layer 2*f* having the wiring patterns (first wiring layer 2*k*, first wiring layer 2*i*) formed on the upper and lower surfaces thereof. At this time, the second wiring layer 2*m* is pasted to the upper layer of the second insulating layer 2*g* and the second wiring layer 2*j* is pasted to the lower layer of the second insulating layer 2*h* in such a manner that each surface having the high degree of roughness faces the insulating layer.

After the lamination, through hole processing shown in step S6 of FIG. 19 is performed. In this case, a plurality of through holes 2*r* are formed at desired positions by using, for example, a drill 14. Note that it is also possible to form the through holes 2*r* by laser.

After the through hole processing, through hole plating formation shown in step S7 is performed. More specifically, a copper plating 2*s* is formed on the inner wall of each through hole, so that the second wiring layer 2*m* in the uppermost layer and the second wiring layer 2*j* in the lowermost layer are connected with the copper plating 2*s*.

After the through hole plating formation is performed, resist formation, exposure/development, and etching shown in step S8 are performed. More specifically, a desired wiring pattern is formed by performing resist formation, exposure/development, and etching on each of the second wiring layer 2*m* in the uppermost layer and the second wiring layer 2*j* in the lowermost layer.

After the resist formation, exposure/development, and etching are performed, the solder resist application shown in step S9 of FIG. 20 is performed. More specifically, the solder resist film 2*d* is formed on the upper layer of the second wiring layer 2*m* in the uppermost layer, while the solder resist film 2*e* is formed on the lower layer of the second wiring layer 2*j* in the lowermost layer, and the solder resist 2*t* is further formed in the through holes 2*jj*.

After the solder resist application, exposure/development shown in step S10 is performed. In this case, exposure and development are performed on the solder resist film 2*d* in the upper layer and the solder resist film 2*e* in the lower layer, so that a desired pattern is formed on each of the desired solder resist films.

After the exposure/development is performed, the surface treatment shown in step S11 is performed. In this case, surface treatment is performed on the bonding leads 2*c* exposed on the upper surface side and the lands 2*jg* exposed on the lower surface side. More specifically, Ni/Au plating 2*u* is formed. In this manner, the wiring substrate 2 including four wiring layers is completed. Also in the wiring substrate 2 of FIG. 20, the unevenness 2*n* is formed in the copper foil forming process on each of the lower surface 2*mb* of the second wiring layer 2*m* (L1) (see FIG. 15), the lower surface 2*kb* of the first wiring layer 2*k* (L2) (see FIG. 15), the upper surface 2*ia* of the first wiring layer 2*i* (L3) (see FIG. 15), and the upper surface 2*ja* of the second wiring layer 2*j* (L4) (see FIG. 15), and the degree of adhesion with the insulating layer is high. However, since each of the upper surface 2*ka* of the first wiring layer 2*k* (L2) (see FIG. 15) and the lower surface 2*ib* of the first wiring layer 2*i* (L3) (see FIG. 15) has a high degree of flatness, the degree of adhesion with the insulating layer is lower than the surface having high degree of roughness, and the peeling 34 shown in FIG. 13 is likely to occur.

<Manufacturing Method of Semiconductor Device>

Subsequently, the manufacturing method of the BGA 9 according to the present embodiment will be described with reference to FIG. 21 to FIG. 24. Each of FIG. 21 to FIG. 24 is a flow diagram and a cross-sectional view showing a procedure for assembling the semiconductor device of FIG. 1.

In the present embodiment, the case where the BGA 9 is assembled by the so-called MAP (Mold Array Package) method in which the assembly is performed by using a multi-chip substrate 10 having a plurality of semiconductor device regions will be described.

Figure 21:
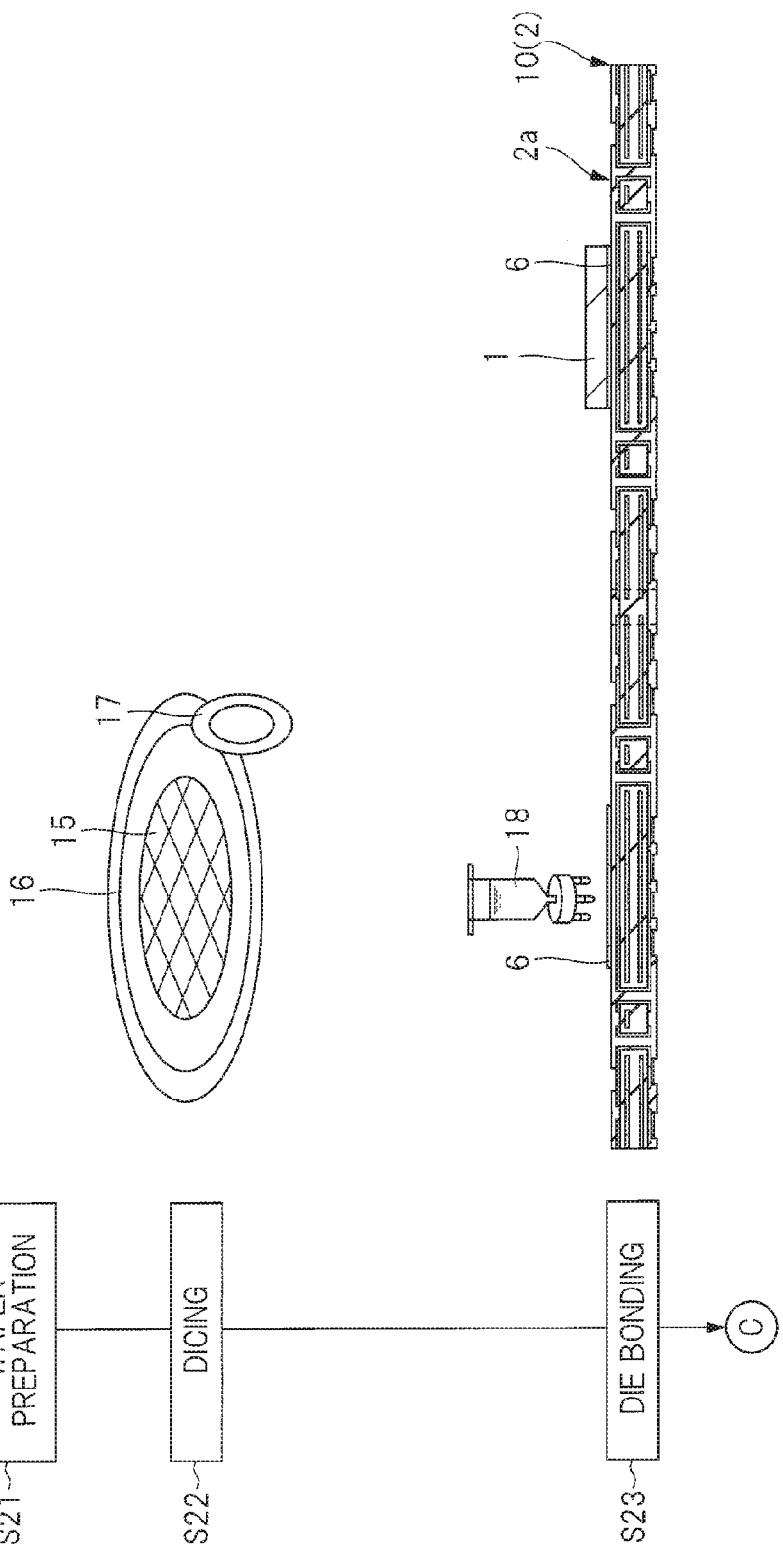
FIG. 21 is a flow diagram, a perspective view, and a cross-sectional view showing a procedure for assembling the semiconductor device of FIG. 1.

First, a wafer preparation in step S21 shown in FIG. 21 is performed.

After the wafer preparation, dicing shown in step S22 is performed. In this case, the semiconductor wafer 15 held by a wafer ring 16 is diced by a dicing blade 17 to obtain a non-defective semiconductor chip 1.

After the dicing, die bonding shown in step S23 is performed. In this case, in each chip region of the multi-chip substrate 10, a die bond material 6 such as a resin paste material is applied onto the substrate by using, for example, a multi-point nozzle 18, and the semiconductor chip 1 is then mounted on the substrate via the die bond material 6.

Figure 22:
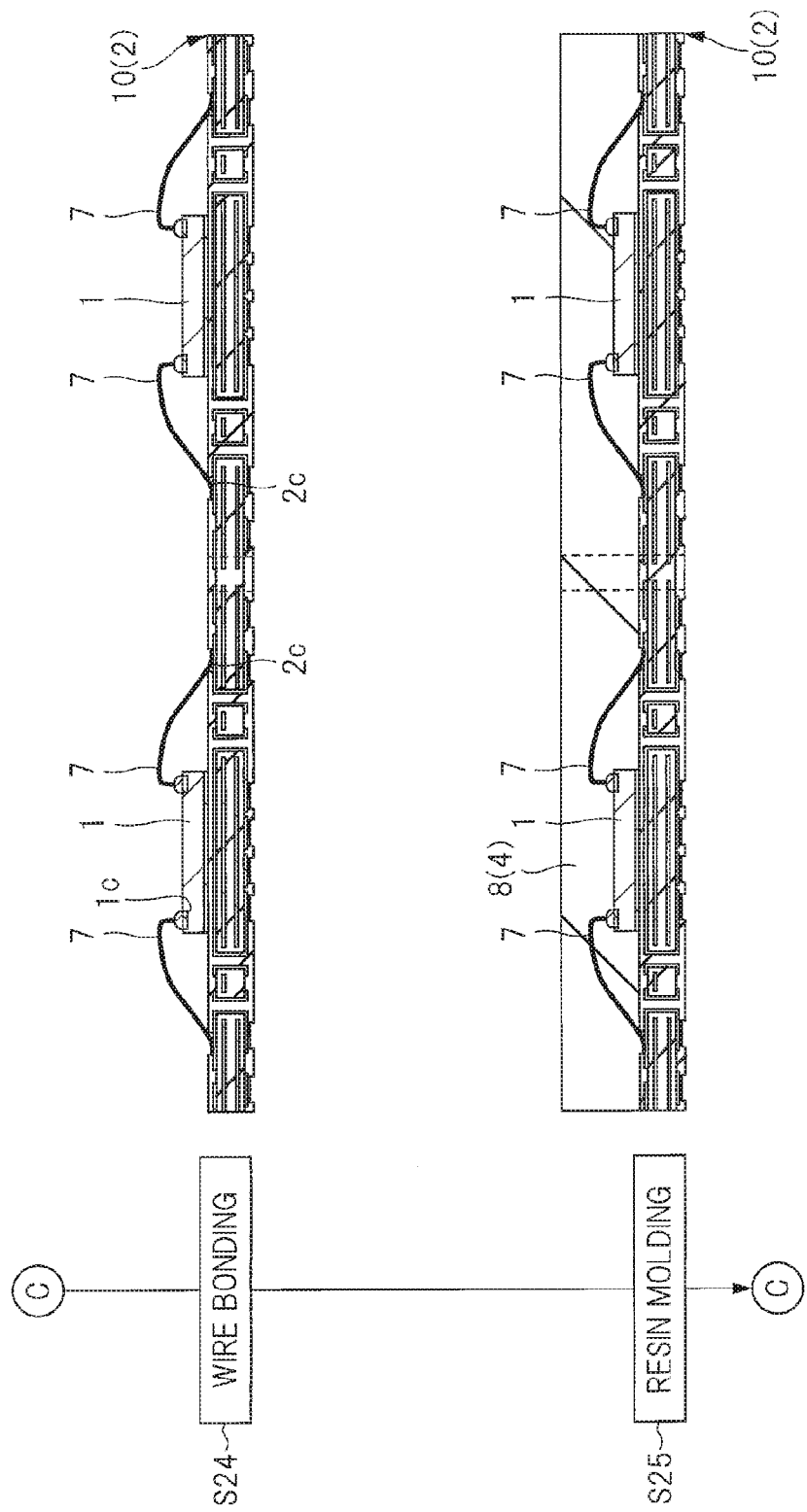
FIG. 22 is a flow diagram and a cross-sectional view showing the procedure for assembling the semiconductor device of FIG. 1.

After the die bonding, wire bonding shown in step S24 of FIG. 22 is performed. In this case, the electrode pads 1*c* of the semiconductor chip 1 and the bonding leads 2*c* of the wiring substrate 2 (multi-chip substrate 10) are electrically connected by the metal wires 7.

After the wire bonding is performed, resin molding in step S25 is performed. More specifically, the semiconductor chips 1 and the plurality of wires 7 are sealed with sealing resin on the multi-chip substrate 10 to form a batch sealing body 8 on the multi-chip substrate 10.

Figure 23:
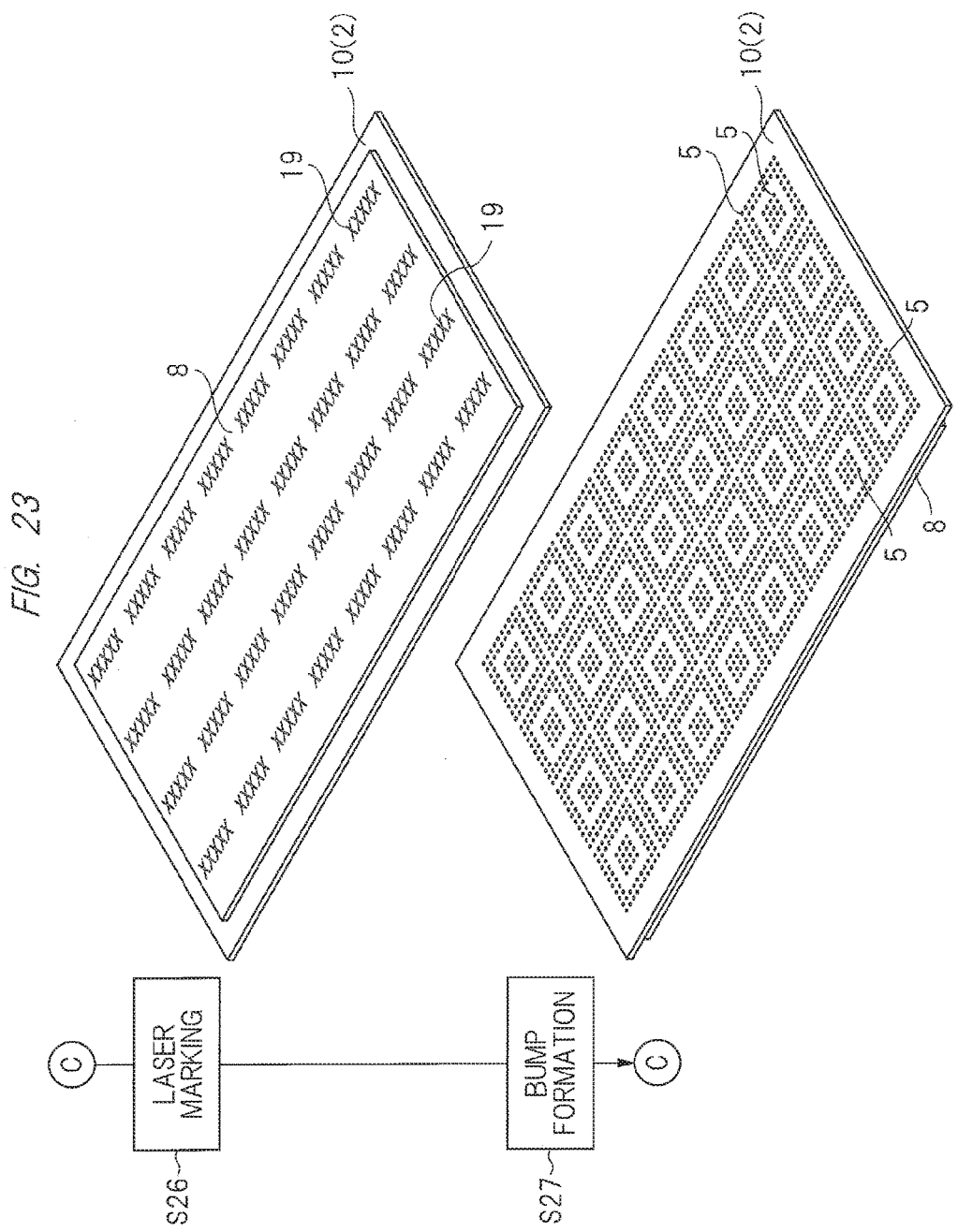
FIG. 23 is a flow diagram and a perspective view showing the procedure for assembling the semiconductor device of FIG. 1.

After completion of the resin molding, laser marking shown in step S26 of FIG. 23 is performed. More specifically, desired marks 19 are placed on the surface of the batch sealing body 8 formed by the resin molding by irradiating the surface with a laser.

After completion of the laser marking, bump formation shown in step S27 is performed. In this case, the plurality of solder balls 5 are mounted on the lower surface of the multi-chip substrate 10 (wiring substrate 2).

Figure 24:
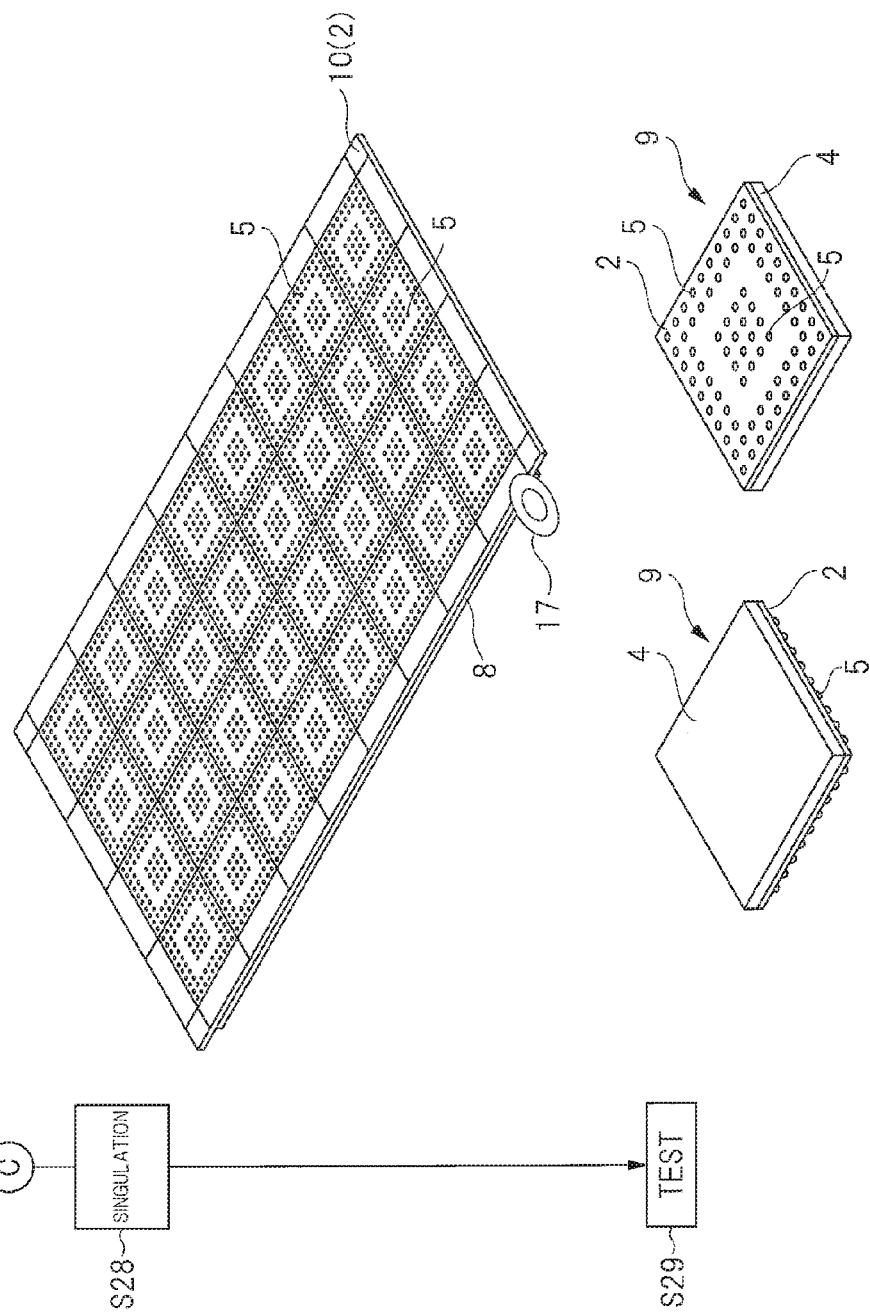
FIG. 24 is a flow diagram and a perspective view showing the procedure for assembling the semiconductor device of FIG. 1.

After completion of the bump formation, singulation in step S28 of FIG. 24 is performed. More specifically, the batch sealing body 8 shown in FIG. 24 formed by the resin molding and the multi-chip substrate 10 are cut together by the dicing blade 17 to separate them into pieces, and furthermore, a test shown in step S29 is performed. As a result, the assembly of the BGA 9 shown in FIG. 24 is completed.

<Mounting Structure (Module) of Semiconductor Device>

Figure 25:
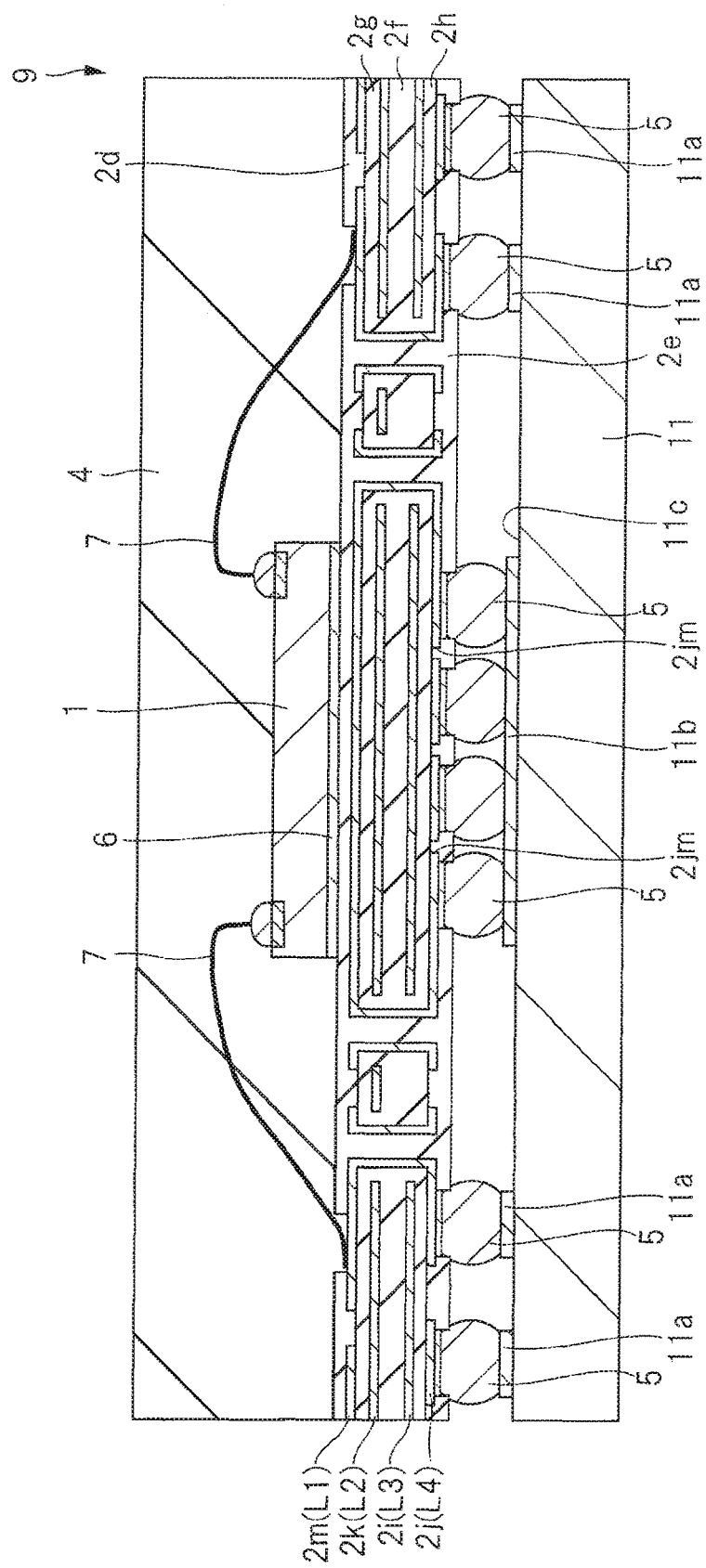
FIG. 25 is a cross-sectional view showing an example of the mounting structure of the semiconductor device shown in FIG. 1.

FIG. 25 is a cross-sectional view showing an example of the mounting structure of the semiconductor device shown in FIG. 1.

The assembled BGA 9 is mounted on the mother board 11 which is the mounting board. At that time, the solder balls 5 are melted by reflowing, so that the solder balls 5 which are external terminals and the bump electrodes 11a formed on the upper surface 11c of the mother board 11 are electrically connected. On the other hand, the solder balls 5 for heat dissipation (thermal balls) placed in the central portion of the BGA 9 and the pattern 11b for heat dissipation of the mother board 11 are electrically connected.

In the BGA 9 of the present embodiment, even when the wiring substrate 2 is heated in the reflow and the out gas is generated inside the substrate, since the first opening portions 2jm and the second opening portions 2jn (see FIG. 17) are provided on the lowermost wiring layer of the wiring substrate 2, the out gas can be released from the lower surface side of the substrate through the first opening portions 2jm and the second opening portions 2jn.

Thus, it is possible to suppress the local increase of the pressure inside the substrate, and as a result, the occurrence of the peeling (crack) 34 of the wiring layer L3 between the wiring layer L3 on the lower surface side and the insulating layer 33 immediately below the wiring layer L3 shown in FIG. 13 can be prevented.

Accordingly, the reliability as the module can also be improved.

First Modification Example

Figure 26:
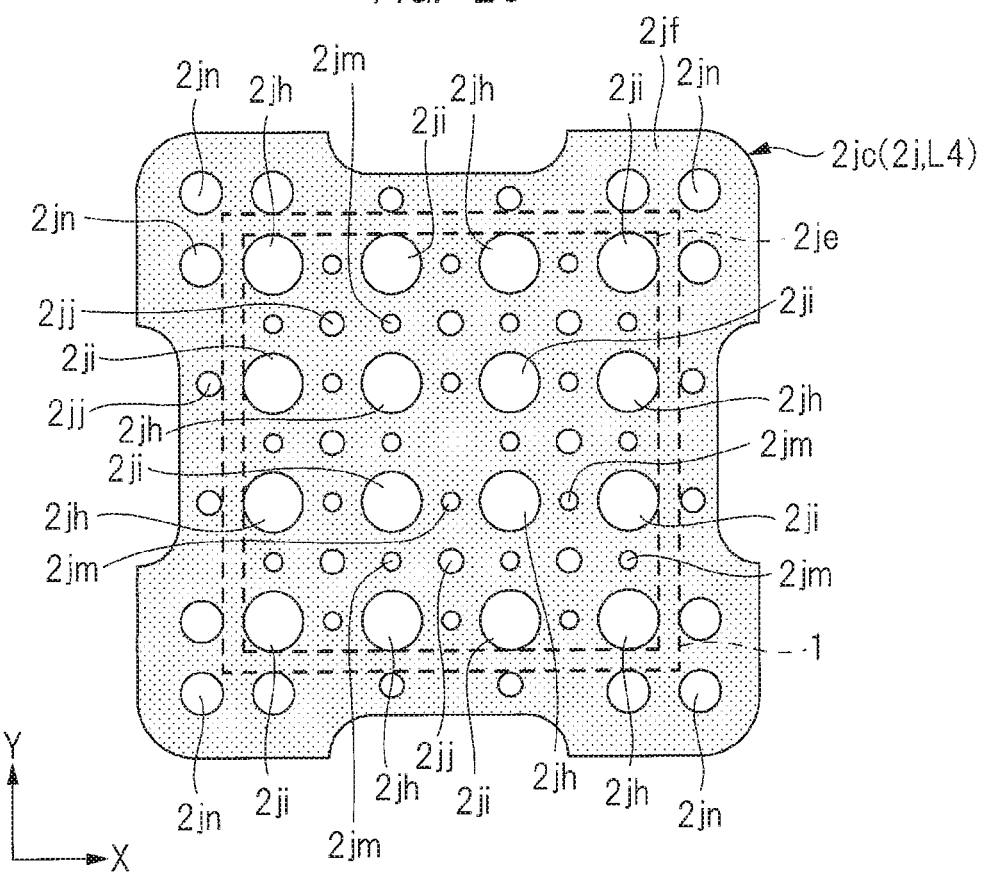
FIG. 26 is a partial plan view showing a first modification example of a positional relationship of the semiconductor chip and the wiring pattern of the lowermost wiring layer in the wiring substrate of the semiconductor device of FIG. 1.
Figure 27:
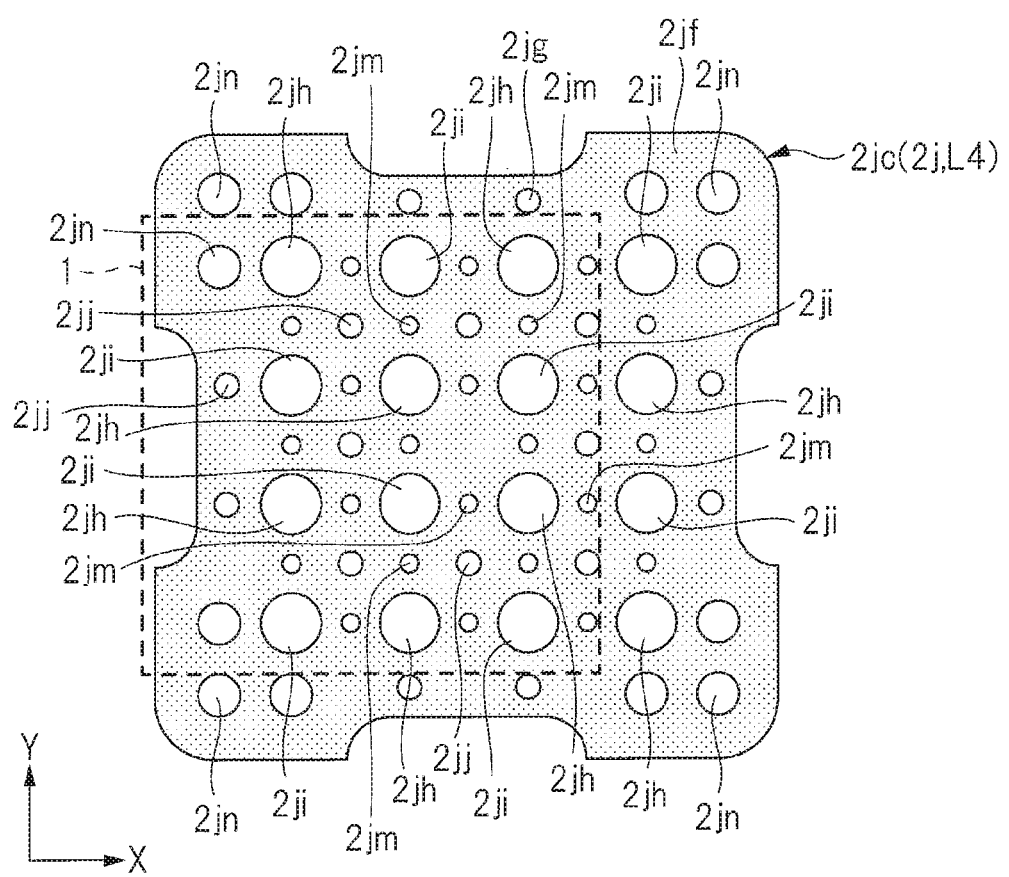
FIG. 27 is a partial plan view showing the first modification example of the positional relationship of the semiconductor chip and the wiring pattern of the lowermost wiring layer in the wiring substrate of the semiconductor device of FIG. 1.
Figure 28:
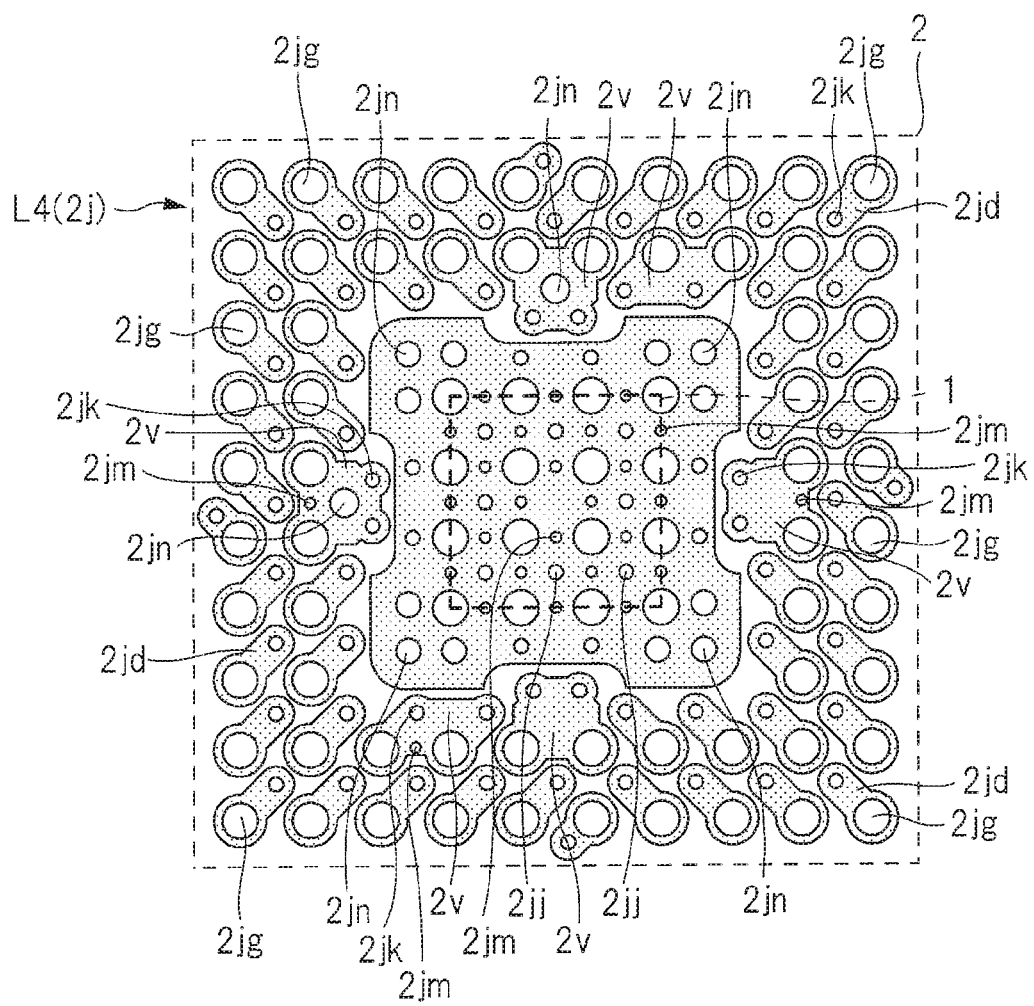
FIG. 28 is a partial plan view showing the first modification example of the wiring pattern of the lowermost wiring layer in the wiring substrate of the semiconductor device of FIG. 1.

FIG. 26 is a partial plan view showing a first modification example of the positional relationship of the semiconductor chip and the wiring pattern of the lowermost wiring layer in the wiring substrate of the semiconductor device of FIG. 1, FIG. 27 is a partial plan view showing the first modification example of the positional relationship of the semiconductor chip and the wiring pattern of the lowermost wiring layer in the wiring substrate of the semiconductor device of FIG. 1, and FIG. 28 is a partial plan view showing the first modification example of the wiring pattern on the back surface of the lowermost wiring layer in the wiring substrate of the semiconductor device of FIG. 1.

FIG. 26 shows a case where the region of the semiconductor chip 1 is larger than the first region (thermal ball region) 2je in the first pattern 2jc of the second wiring layer 2j (L4). Also, FIG. 27 shows a structure in which the region of the mounted semiconductor chip 1 is displaced relative to the first pattern 2jc.

Also in the structure shown in FIG. 26 and the structure shown in FIG. 27, the plurality of first opening portions 2jm are formed in the first region 2je and the plurality of second opening portions 2jn are formed in the second region 2jf outside the first region 2je, and therefore, the out gas generated within the substrate in the heating can be released from the lower surface side of the substrate to the outside through the first opening portions 2jm and the second opening portions 2jn.

As a result, the occurrence of the peeling (crack) 34 of the wiring layer L3 between the wiring layer L3 on the lower surface side and the insulating layer 33 immediately below the wiring layer L3 shown in FIG. 13 can be prevented, and the reliability of the BGA 9 can be improved.

The structure in FIG. 28 shows a case where a plurality of third patterns 2v different from the second pattern 2jd are provided also in a region other than the first pattern 2jc (other than the chip region) in the second wiring layer 2j (L4). The third pattern 2v has a plurality of lands 2jg, and can be used as, for example, a power supply pattern, a GND pattern, a heat dissipation plane, a heat dissipation pattern, or the like. These patterns are provided with the through holes 2jk connected to the bonding lead 2c of the wiring layer L1, the pattern of the wiring layer L2, the pattern of the wiring layer L3, and the like shown in FIG. 4, and some of the third patterns 2v are provided with the first opening portions 2jm. Also, some of the third patterns 2v are provided with the second opening portions 2jn.

By providing the first opening portions 2jm and the second opening portions 2jn in the third pattern 2v as described above, the out gas generated within the substrate can be released to the outside through the first opening portions 2jm and the second opening portions 2jn.

As a result, the reliability of the BGA 9 can be improved.

Second Modification Example

Figure 29:
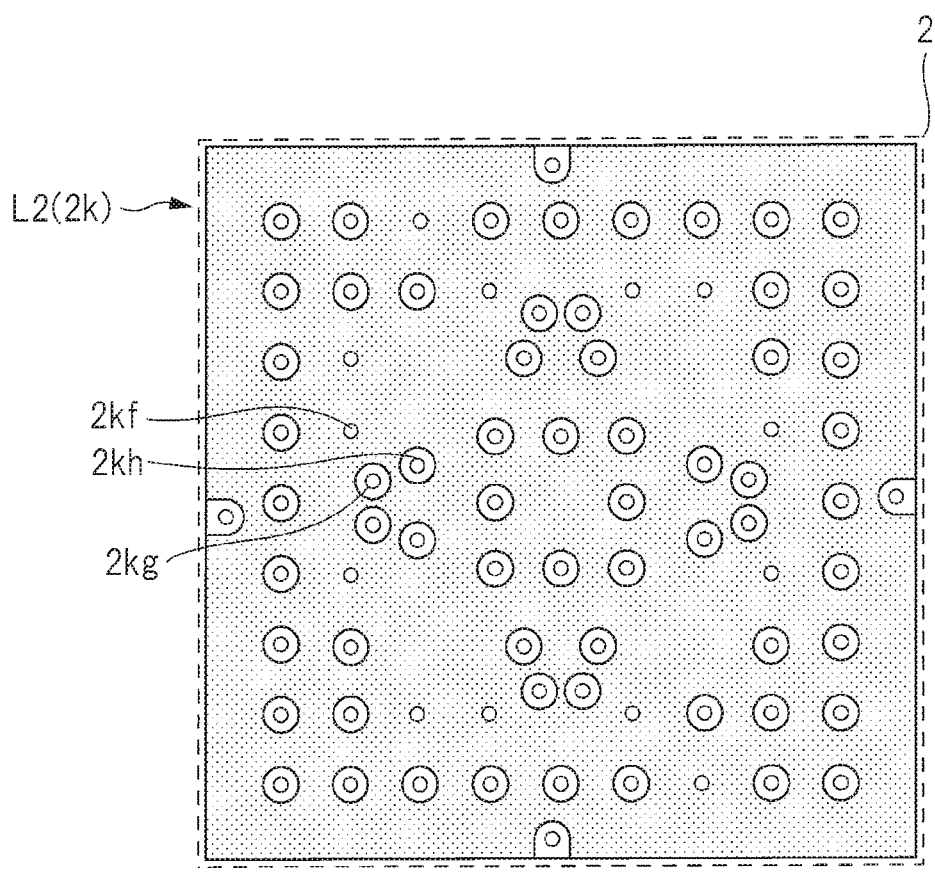
FIG. 29 is a plan view showing a second modification example of the wiring pattern of the second wiring layer (L2) from the top in the wiring substrate of the semiconductor device shown in FIG. 1.
Figure 30:
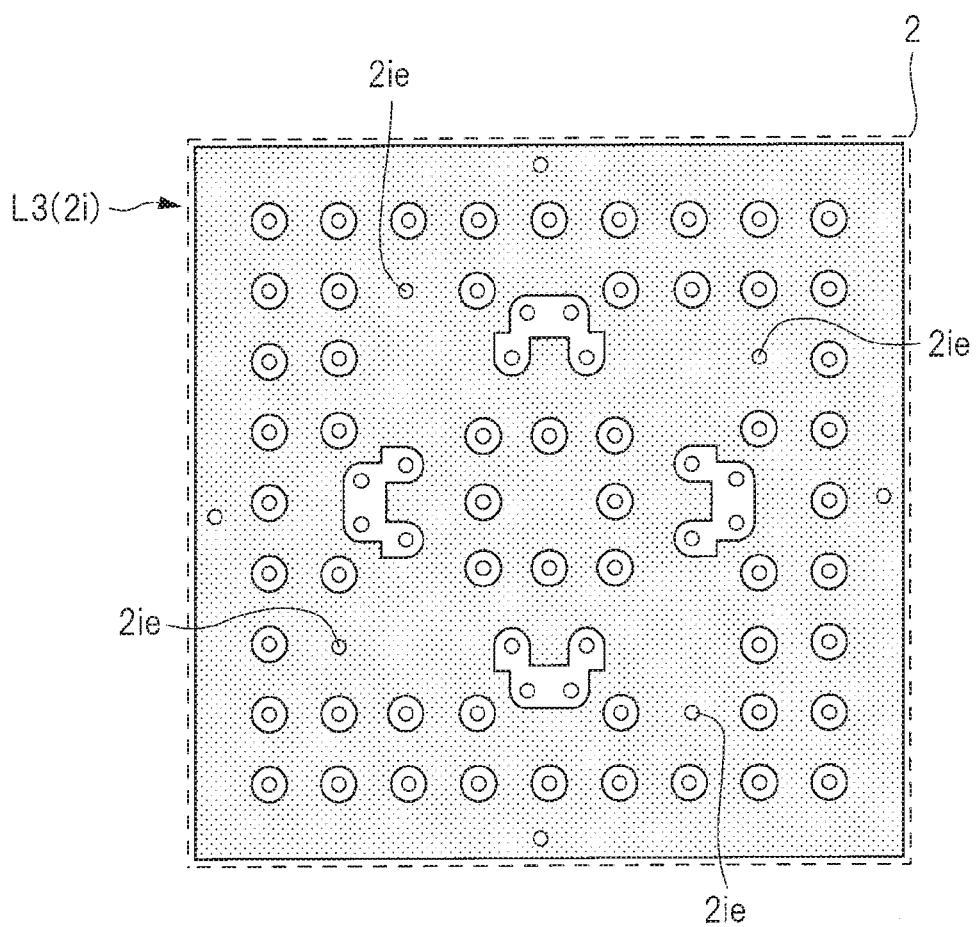
FIG. 30 is a plan view showing the second modification example of the wiring pattern of the third wiring layer (L3) from the top in the wiring substrate of the semiconductor device shown in FIG. 1.

FIG. 29 is a plan view showing a second modification example of the wiring pattern of the second wiring layer (L2) from the top in the wiring substrate of the semiconductor device shown in FIG. 1, and FIG. 30 is a plan view showing the second modification example of the wiring pattern of the third wiring layer (L3) from the top in the wiring substrate of the semiconductor device shown in FIG. 1.

The structure in FIG. 29 shows the case where the first wiring layer 2k (L2) is comprised of one type of pattern instead of the divided patterns, and the structure in FIG. 30 similarly shows the case where the first wiring layer 2i (L3) is comprised of one type of pattern instead of the divided patterns.

In this case, since the area of the wiring pattern of the first wiring layer 2i (L3) of FIG. 30 is larger than the area of the wiring pattern (first pattern 2jc) of the second wiring layer 2j (L4) shown in FIG. 9, the out gas generated inside the substrate is further difficult to release.

Therefore, by providing the first opening portions 2jm and the second opening portions 2jn in the second wiring layer 2j (L4) of the wiring substrate 2 like in the BGA 9 of the present embodiment, the out gas generated inside the substrate can be released to the outside through the first opening portions 2jm and the second opening portions 2jn, and as a result, the reliability of the BGA 9 can be improved.

Note that, even if the first wiring layer 2i (L3) is comprised of two or more patterns instead of a single pattern, the out gas is difficult to release when any one of the patterns is larger than the first pattern 2jc of the second wiring layer 2j (L4). Therefore, also in this case, by providing the first opening portions 2jm and the second opening portions 2jn in the second wiring layer 2j (L4) of the wiring substrate 2 similarly to the above, the out gas generated within the substrate can be released to the outside from the first opening portions 2*jm* and the second opening portions 2*jn*.

Third Modification Example

Figure 31:
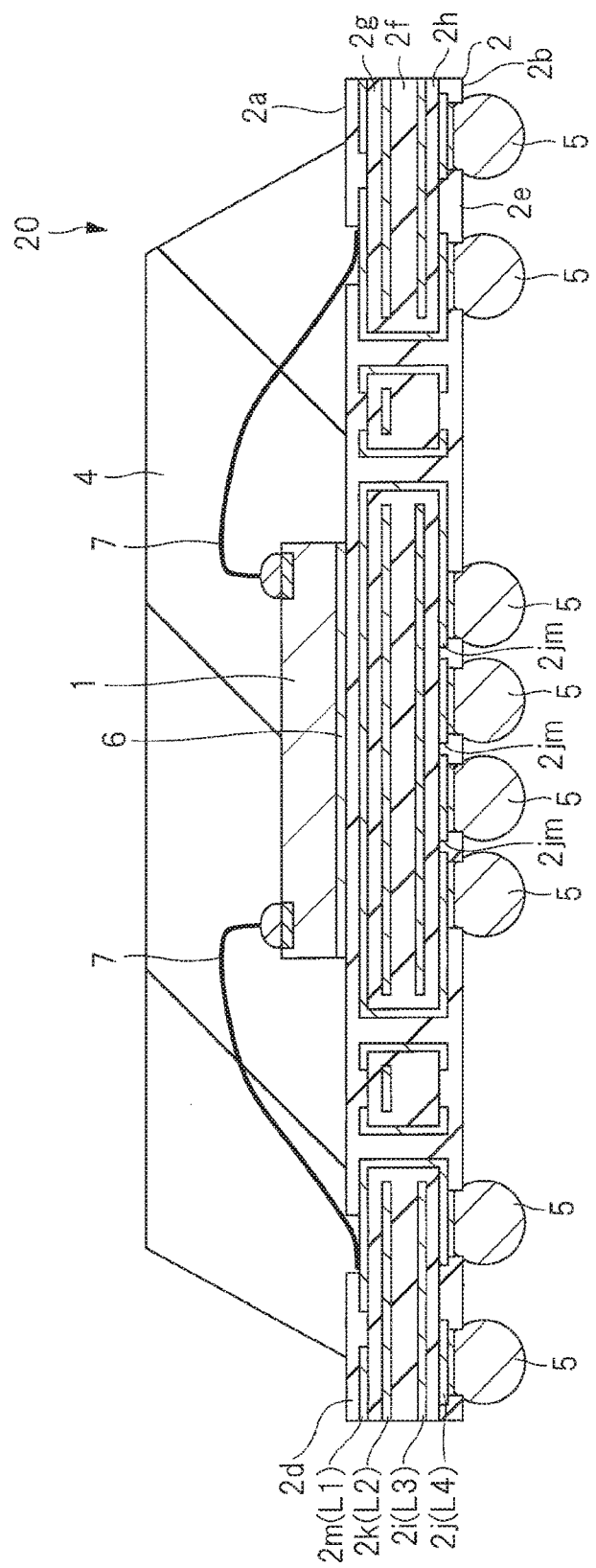
FIG. 31 is a cross-sectional view showing a structure of a semiconductor device according to a third modification example of the embodiment.

FIG. 31 is a cross-sectional view showing a structure of a semiconductor device of a third modification example of the embodiment.

A BGA 20 shown in FIG. 31 is a semiconductor device assembled by single molding. More specifically, the BGA 20 has the sealing body 4 formed by a cavity corresponding to each semiconductor device unlike those formed by batch molding. Therefore, the BGA 20 is a semiconductor device having a structure in which the peripheral portion of the upper surface 2*a* of the wiring substrate 2 is exposed.

Also in the BGA 20 described above, by providing the first opening portions 2*jm* and the second opening portions 2*jn* (see FIG. 17) in the second wiring layer 2*j* (L4) of the wiring substrate 2, the out gas generated inside the substrate can be released to the outside through the first opening portions 2*jm* and the second opening portions 2*jn*, and as a result, the reliability of the BGA 20 can be improved.

In addition, even in a semiconductor device of flip-chip structure in which the electrical connection between the semiconductor chip 1 and the bonding leads 2*c* of the substrate is made by the bump electrodes instead the wires 7, by providing the first opening portions 2*jm* and the second opening portions 2*jn* in the second wiring layer 2*j* (L4) of the wiring substrate 2, the out gas generated inside the substrate can be released to the outside through the first opening portions 2*jm* and the second opening portions 2*jn*.

As a result, even in the semiconductor device of the flip-chip structure, the reliability thereof can be improved.

Fourth Modification Example

Figure 32:
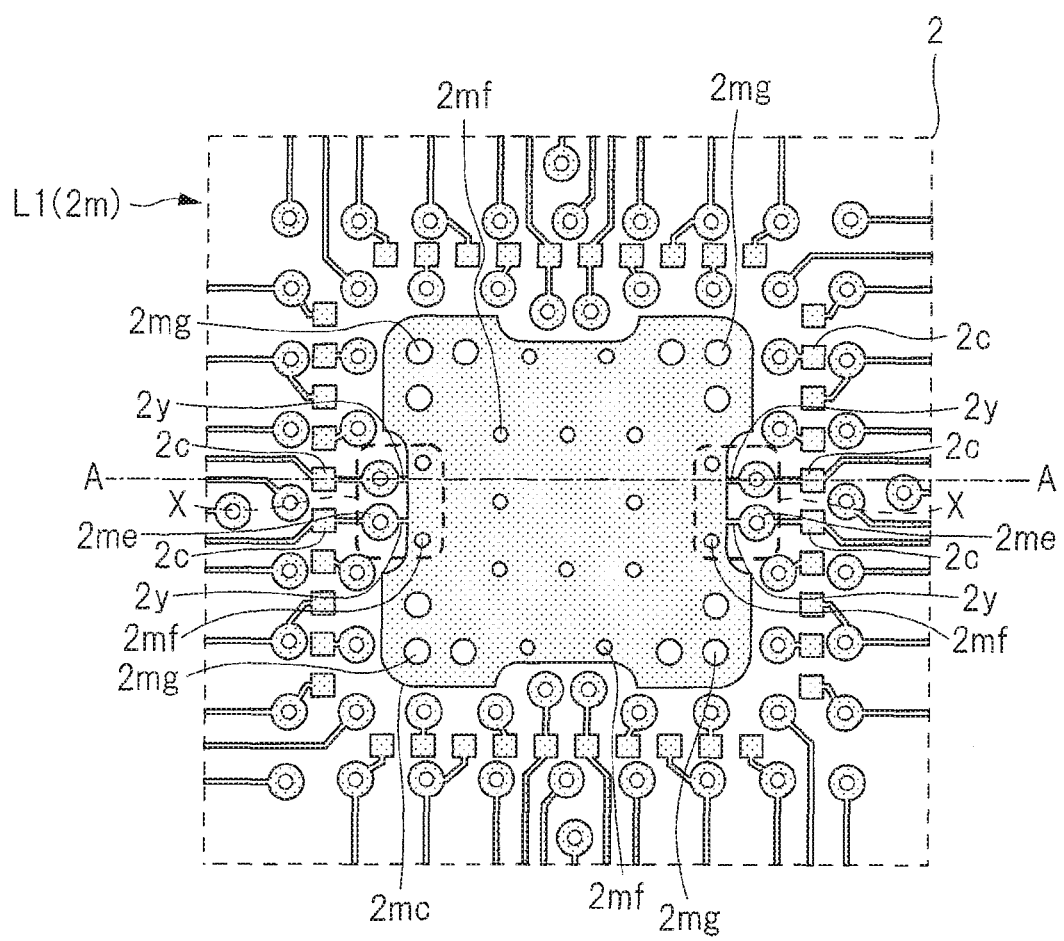
FIG. 32 is a plan view showing a fourth modification example of the wiring pattern of the uppermost wiring layer in the wiring substrate of the semiconductor device of FIG. 1.
Figure 33:
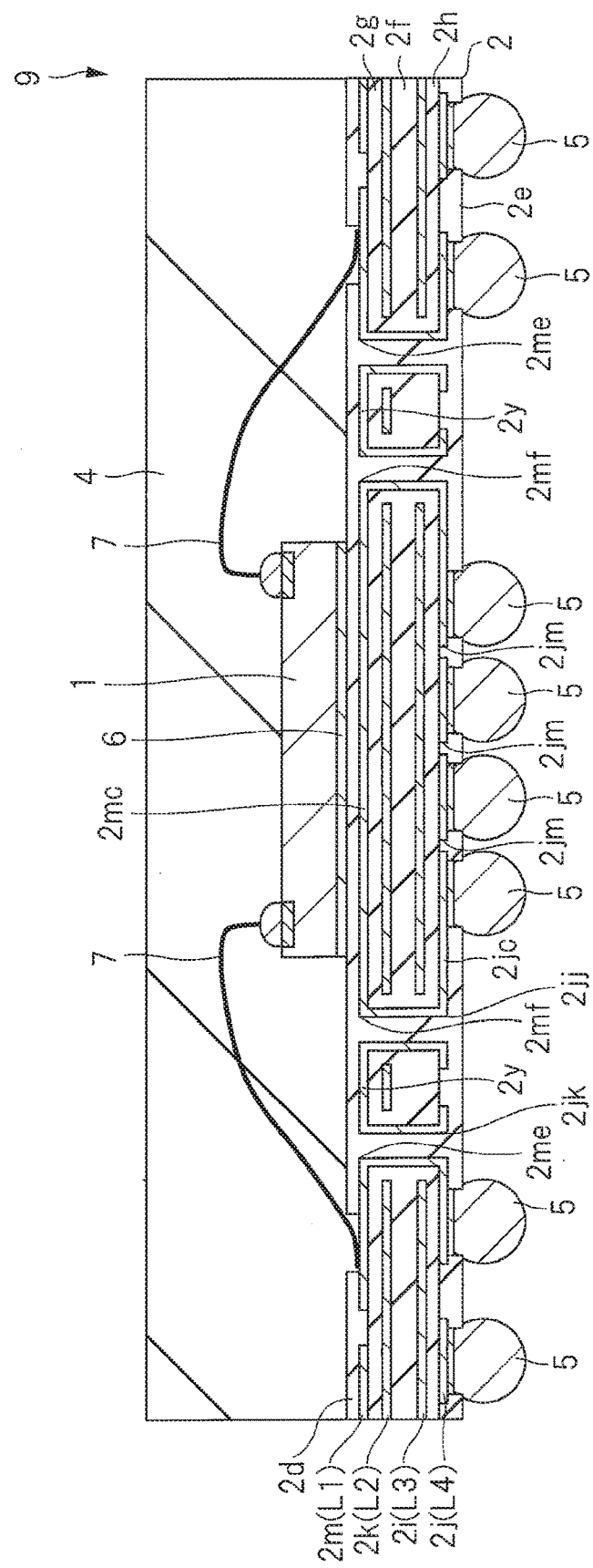
FIG. 33 is a cross-sectional view showing the fourth modification example of the structure of the semiconductor device taken along line A-A in FIG. 32.

FIG. 32 is a plan view showing a fourth modification example of the wiring pattern of the uppermost wiring layer in the wiring substrate of the semiconductor device of FIG. 1, and FIG. 33 is a cross-sectional view showing the fourth modification example of the structure of the semiconductor device taken along line A-A in FIG. 32.

In the wiring layer shown in FIG. 32, the first pattern 2*mc* of the second wiring layer 2*m* (L1) in the uppermost layer indicates the GND/power supply pattern.

The bonding lead 2*c* shown in FIG. 33 is electrically connected to the semiconductor chip 1 via the wire 7.

As shown in the X portion of FIG. 32, the first pattern 2*mc* and the through hole 2*me* connected to the bonding lead 2*c* are electrically connected via the wiring 2*y* in the pattern of the second wiring layer 2*m* (L1) in the uppermost layer. In other words, the bonding lead 2*c* and the first pattern 2*mc* are electrically connected to each other.

Also, as shown in FIG. 33, the first pattern 2*mc* of the second wiring layer 2*m* (L1) in the upper most layer is connected to the first pattern 2*jc* of the second wiring layer 2*j* (L4) in the lowermost layer via the through hole 2*mf* of the second wiring layer 2*m* (L1) in the uppermost layer and the through hole 2*jj* of the second wiring layer 2*j* (L4) in the lowermost layer. In other words, the first pattern 2*mc* of the second wiring layer 2*m* (L1) in the uppermost layer is electrically connected to the first pattern 2*jc* of the second wiring layer 2*j* (L4) in the lowermost layer.

Further, as shown in FIG. 33, the bonding lead 2*c* of the second wiring layer 2*m* (L1) in the uppermost layer is connected to the second pattern 2*jd* of the second wiring layer 2*j* (L4) in the lowermost layer shown in FIG. 9 via the through hole 2*me* of the second wiring layer 2*m* (L1) in the uppermost layer and the through hole 2*jk* of the second wiring layer 2*j* (L4) in the lowermost layer. In addition, in the case of FIG. 28 according to the first modification example, the bonding lead 2*c* of the second wiring layer 2*m* (L1) in the uppermost layer of FIG. 33 is connected to the third pattern 2*v* of the second wiring layer 2*j* (L4) in the lowermost layer shown in FIG. 28 via the through hole 2*me* of the second wiring layer 2*m* (L1) in the uppermost layer and the through hole 2*jk* of the second wiring layer 2*j* (L4) in the lowermost layer. In other words, the bonding lead 2*c* of the second wiring layer 2*m* (L1) in the uppermost layer is electrically connected to the second pattern 2*jd* of the second wiring layer 2*j* (L4) in the lowermost layer or the third pattern 2*v* of the second wiring layer 2*j* (L4) in the lowermost layer.

Therefore, in the case where the bonding lead 2*c* is GND, the first pattern 2*mc* of the second wiring layer 2*m* (L1) in the uppermost layer, the first pattern 2*jc* of the second wiring layer 2*j* (L4) in the lowermost layer, and the second pattern 2*jd* of the second wiring layer 2*j* (L4) in the lowermost layer are the GND patterns. Also, in the case of FIG. 28 according to the first modification example, the third pattern 2*v* of the second wiring layer 2*j* (L4) in the lowermost layer is also the GND pattern. Similarly, in the case where the bonding lead 2*c* is power supply, the first pattern 2*mc* of the second wiring layer 2*m* (L1) in the uppermost layer, the first pattern 2*jc* of the second wiring layer 2*j* (L4) in the lowermost layer, and the second pattern 2*jd* of the second wiring layer 2*j* (L4) in the lowermost layer are the power supply patterns. Also, in the case of FIG. 28 according to the first modification example, the third pattern 2*v* of the second wiring layer 2*j* (L4) in the lowermost layer is also the power supply pattern.

Further, also in the wiring substrate 2 described above, by providing the first opening portions 2*jm* and the second opening portions 2*jn* in the second wiring layer 2*j* (L4), the out gas generated inside the substrate can be released to the outside through the first opening portions 2*jm* and the second opening portions 2*jn*.

Fifth Modification Example

Figure 34:
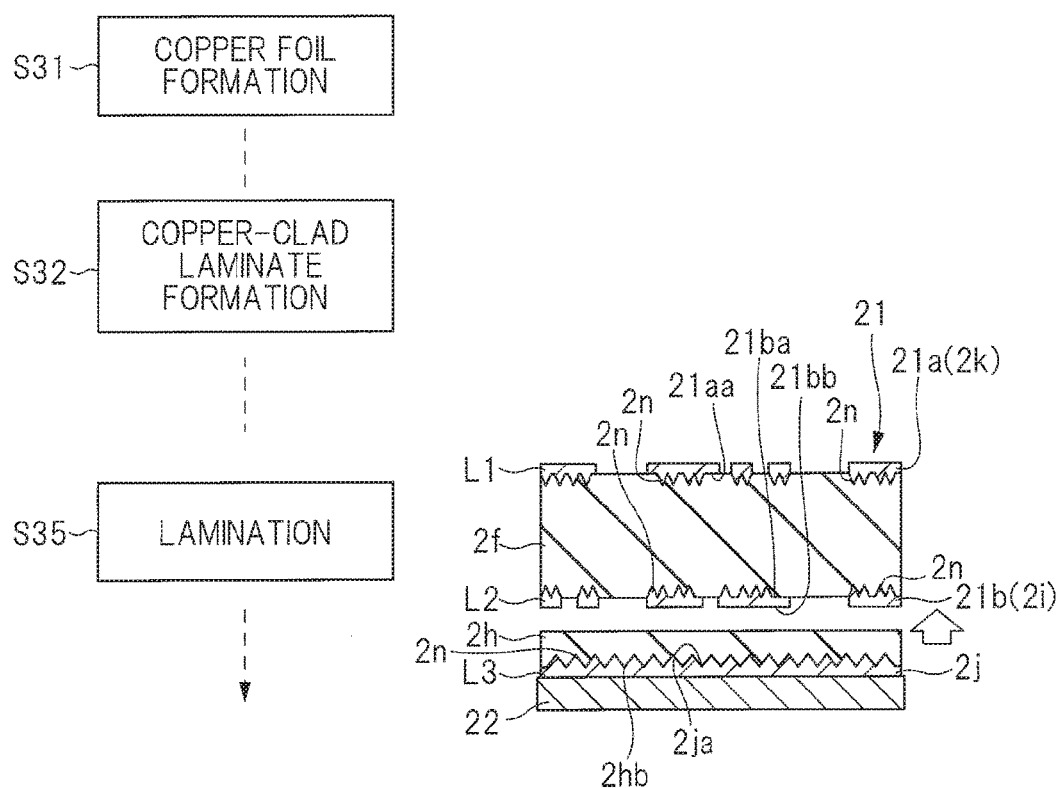
FIG. 34 is a flow diagram and a cross-sectional view showing a procedure for assembling a wiring substrate according to a fifth modification example of the embodiment.

FIG. 34 is a flow diagram and a cross-sectional view showing a procedure for assembling a wiring substrate according to a fifth modification example of the embodiment, and FIG. 34 shows a manufacturing method of a wiring substrate 21 having three wiring layers. However, illustrations of the process similar to that of the wiring substrate 2 having four wiring layers are omitted in FIG. 34.

First, the copper foil formation shown in step S31 of FIG. 34 is performed. In this case, for example, a copper foil is formed by electrolytic copper foil manufacturing method in the same manner as the case of the four wiring layers. More specifically, the electrolytic copper foil 2*q* is formed on the drum electrode (cathode) 13 by using copper sulfate solution 12 shown in FIG. 18.

After the copper foil formation, the copper-clad laminate formation shown in step S32 is performed. In this case, like the process shown in FIG. 18, the copper foil is pasted on the upper and lower surfaces of the first insulating layer 2*f* which is the insulating layer serving as the core layer in such a manner that the roughened surface of each copper foil faces the insulating layer.

After the copper-clad laminate formation, the resist formation (exposure/development) and etching are performed in the same manner as the method shown in FIG. 18.

After the resist formation and etching, lamination shown in step S35 is performed. More specifically, the second insulating layer 2h is pasted by applying pressure by a block 22 to the lower surface 21bb of the first insulating layer 2f having the wiring patterns (upper first wiring layer 21a, lower first wiring layer 21b) made of the copper foil formed on the upper and lower surfaces thereof. At this time, the second wiring layer 2j is pasted to the lower layer (lower surface 2hb) of the second insulating layer 2h in such a manner that the surface having the high degree of roughness faces the second wiring insulating layer 2h.

After the lamination, the wiring substrate 21 having three wiring layers is assembled through the assembly process similar to that of the wiring substrate 2 having four wiring layers.

Also in the wiring substrate 21 of FIG. 34, the unevenness 2n is formed in the copper foil forming process on each of the lower surface 21aa of the upper first wiring layer 21a (L1, first wiring layer 2k), the upper surface 21ba of lower first wiring layer 21b (L2, first wiring layer 2i), and the upper surface 2ja of the second wiring layer 2j (L3), and the degree of adhesion with the insulating layer is high. However, since the lower surface 21bb of the lower first wiring layer 21b (L2) has a high degree of flatness, the degree of adhesion with the insulating layer is lower than the surface having high degree of roughness, and the peeling 34 shown in FIG. 13 is likely to occur.

Therefore, also in the wiring substrate 21 having three wiring layers, by providing the first opening portions 2jm and the second opening portions 2jn in the second wiring layer 2j (L3) in the lowermost layer, the out gas generated within the substrate can be released to the outside through the first opening portions 2jm and the second opening portions 2jn.

Comparative Examination Example

Figure 35:
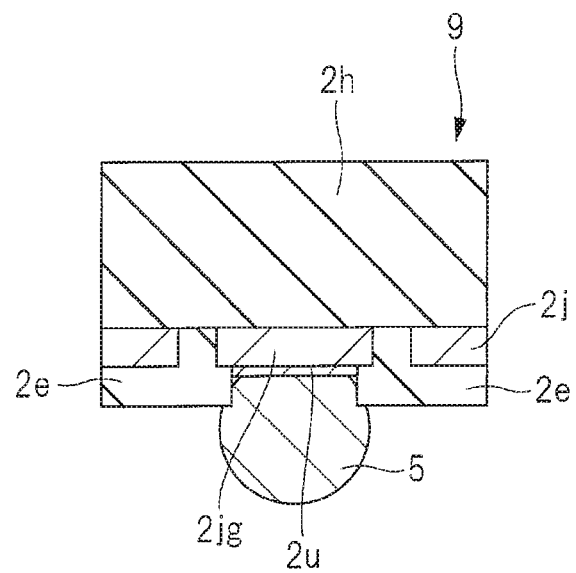
FIG. 35 is a partial cross-sectional view showing an SMD structure in a wiring substrate of a semiconductor device according to a comparative examination example.
Figure 36:
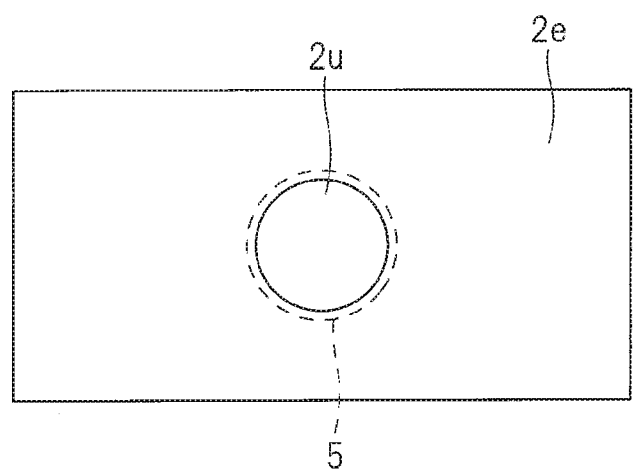
FIG. 36 is a partial plan view showing the SMD structure shown in FIG. 35.
Figure 37:
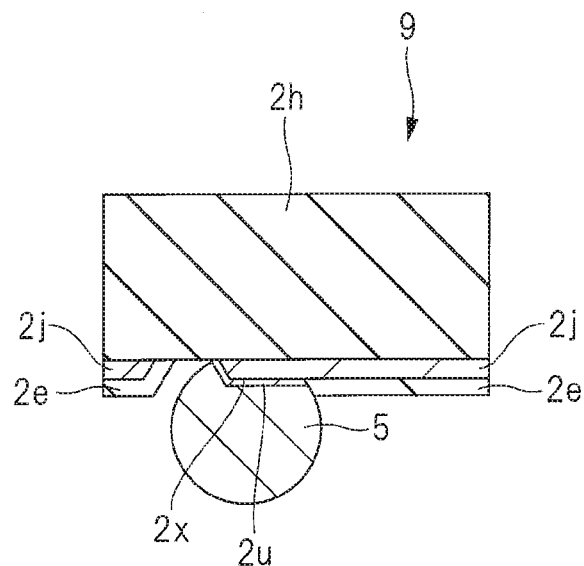
FIG. 37 is a partial cross-sectional view showing an NSMD structure in the wiring substrate of the semiconductor device according to the comparative examination example.
Figure 38:
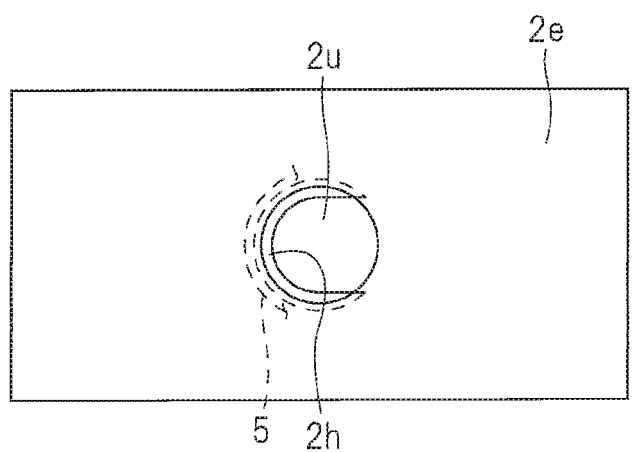
FIG. 38 is a partial plan view showing the NSMD structure shown in FIG. 37.

FIG. 35 is a partial cross-sectional view showing an SMD structure in a wiring substrate of a semiconductor device according to a comparative examination example, FIG. 36 is a partial plan view showing the SMD structure shown in FIG. 35, FIG. 37 is a partial cross-sectional view showing an NSMD structure in a wiring substrate of a semiconductor device according to a comparative examination example, and FIG. 38 is a partial plan view showing the NSMD structure shown in FIG. 37.

FIG. 35 shows a connection structure between the land 2jg and the solder ball 5 adopted in the BGA 9 according to the present embodiment, and FIG. 36 shows a planar structure of the land 2jg of FIG. 35.

The land structure shown in FIG. 35 and FIG. 36 is the SMD (Solder Mask Defined) structure. In the SMD structure, the peripheral portion of each of the plurality of lands 2jg is covered with the solder resist film (second protective film) 2e, and therefore, the underlying insulating layer of the land 2jg is not seen in the plan view. For the land 2jg with the structure described above, each of the plurality of solder balls 5 is provided to be bonded with each of the plurality of lands 2jg and the solder resist film 2e on the peripheral portion of each of the lands 2jg. Ni/Au plating 2u is formed on the land 2jg.

In the land 2jg having the SMD structure described above, since the peripheral portion of the land 2jg is covered with the solder resist film 2e, the out gas generated inside the substrate is difficult to release. However, since the land 2jg is difficult to peel off, it has the feature that the reliability of the wiring substrate 2 is high.

On the other hand, FIG. 37 shows a connection structure between a land 2x and the solder ball 5 examined by the inventors of the present application, and FIG. 38 shows a planar structure of the land 2x of FIG. 37. More specifically, the land structure shown in FIG. 37 and FIG. 38 is the NSMD (Non-Solder Mask Defined) structure. In the NSMD structure, each of the plurality of lands 2x is not covered with the solder resist film (second protective film) 2e and the entire land 2x is exposed. On the land 2x, Ni/Au plating 2u is formed. Furthermore, the underlying insulating layer (second insulating layer 2h) of the land 2x is visible (exposed) in the plan view in the NSMD structure. For the land 2x having the structure described above, each of the plurality of solder balls 5 is provided to connect to each of the plurality of lands 2x.

In the land 2x having the NSMD structure, the underling insulating layer (second insulating layer 2h) of the land 2x is visible (exposed) as described above, and thus the out gas generated inside the substrate is easy to release in the NSMD structure. Further, since the connection area between the solder ball 5 and the land 2x increases, the connection strength of the solder can be increased and the lifetime of the solder connection portion can be increased. However, since the connection strength of the solder is high, a problem that the land 2x peels off from the substrate is likely to occur when an impact is applied to the solder ball 5 from the outside, and the NSMD structure has a feature that the reliability of the substrate is lower than that of the SMD structure.

In the semiconductor device according to the present embodiment, when the NSMD structure is adopted as the land structure, the effect for preventing the peeling of the wiring layer and the insulating layer can be obtained from the viewpoint of gas release. However, when the impact resistance is taken into consideration, it is preferable to adopt the SMD structure, and the reliability of the substrate and semiconductor device can be increased in such a case.

Other Modification Examples

In the foregoing, the invention made by the inventors of the present application has been specifically described based on the embodiments, but the present invention is not limited to the embodiments described above, and it goes without saying that various modifications can be made within the range not departing from the gist thereof.

In the embodiments and modification examples described above, the case where a plurality of thermal balls are provided in the first pattern in the lowermost layer has been described, but the thermal balls may not be necessarily provided.

Also, in the embodiments and modification examples described above, the case where the wiring substrate 2 is a substrate including the core has been described, but the wiring substrate 2 may be a coreless substrate. More specifically, this is because since a copper foil is pasted onto the insulating layer to form the substrate even in the case of the coreless substrate, the degree of adhesion of the roughened surface is high and the degree of adhesion with the insulating layer pasted to both sides (or one side (in the case of three-layer substrate)) is low, and the peeling is likely to occur particularly in the lowermost wiring layer.

In addition, modification examples can be applied in combination with each other within the scope not departing from the gist of the technical concept described in the above embodiments.

REFERENCE SIGNS LIST 1 semiconductor chip
2 wiring substrate
2c bonding lead
2d solder resist film (first protective film)
2da upper surface (first surface)
2e solder resist film (second protective film)
2f first insulating layer
2fa upper surface (first surface)
2fb lower surface (second surface)
2g second insulating layer
2ga upper surface (first surface)
2h second insulating layer
2hb lower surface (first surface)
2i first wiring layer
2ia upper surface (second surface)
2ib lower surface (first surface)
2ic first pattern
2id second pattern
2j second wiring layer
2ja upper surface
2jb lower surface (first surface)
2jc first pattern
2jd second pattern
2je first region
2jf second region
2jg land
2jh first land
2ji second land
2jj through hole
2jk through hole
2jm first opening portion (opening portion)
2jn second opening portion (opening portion)
2k first wiring layer
2ka upper surface (first surface)
2kc first pattern
2kd second pattern
2m second wiring layer
4 sealing body
5 solder ball (external terminal)
7 wire
9 BGA (semiconductor device)

The invention claimed is:

1. A semiconductor device comprising:
a wiring substrate including a first insulating layer, a first protective film covering a first surface of the first insulating layer, a first wiring layer bonded with a second surface of the first insulating layer on a side opposite to the first surface of the first insulating layer, a second insulating layer bonded with a first surface of the first wiring layer, a second wiring layer bonded with a first surface of the second insulating layer, and a second protective film covering a first surface of the second wiring layer; and
a semiconductor chip fixed to a first surface of the first protective film via an adhesive agent,
wherein a degree of flatness of a second surface of the first wiring layer on a side opposite to the first surface of the first wiring layer is lower than a degree of flatness of the first surface of the first wiring layer,
the first wiring layer includes a first pattern,
the second wiring layer includes a first pattern and a plurality of second patterns,
the first pattern provided in the second wiring layer is arranged at a position overlapping the first pattern provided in the first wiring layer,
an area of the first pattern provided in the second wiring layer is larger than a total area of the plurality of second patterns provided in the second wiring layer in a plan view, and
opening portions through which a part of the second insulating layer is exposed are formed in the first pattern provided in the second wiring layer.

2. The semiconductor device according to claim 1,
wherein an area of the first pattern provided in the second wiring layer is larger than an area of the semiconductor chip in a plan view.

3. The semiconductor device according to claim 2,
wherein the semiconductor chip is located inside the first pattern provided in the second wiring layer in a transparent plan view.

4. The semiconductor device according to claim 3,
wherein the first pattern of the second wiring layer includes a plurality of lands exposed from the second protective film, and
a plurality of solder balls are respectively formed on the plurality of lands.

5. The semiconductor device according to claim 4,
wherein the plurality of lands of the first pattern of the second wiring layer include a first land and a second land arranged to be adjacent to each other, and
a first opening portion through which a part of the second insulating layer is exposed is formed between the first land and the second land.

6. The semiconductor device according to claim 5,
wherein the first pattern of the second wiring layer includes a first region in which the plurality of lands are formed and a second region located outside the first region,
the opening portions include the first opening portion and a second opening portion different from the first opening portion,
the first opening portion is arranged in the first region, and the second opening portion is arranged in the second region, and
a width of the first opening portion is narrower than a width of the second opening portion.

7. The semiconductor device according to claim 6,
wherein the first pattern provided in the second wiring layer is arranged inside the first pattern of the first wiring layer in a transparent plan view.

8. The semiconductor device according to claim 7,
wherein the plurality of second patterns of the second wiring layer respectively include a plurality of lands exposed from the second protective film, and
a plurality of solder balls are respectively formed on the plurality of lands.

9. The semiconductor device according to claim 8,
wherein a peripheral portion of each of the plurality of lands is covered with the second protective film, and
each of the plurality of solder balls is provided to be bonded with each of the plurality of lands and the second protective film on the peripheral portion of each of the plurality of lands.

10. A semiconductor device comprising:
a wiring substrate including a first insulating layer, a first protective film located on a first surface side of the first insulating layer, a first wiring layer bonded with a second surface of the first insulating layer on a side opposite to the first surface of the first insulating layer, a second insulating layer bonded with a first surface of the first wiring layer, a second wiring layer bonded with a first surface of the second insulating layer, and a second protective film covering a first surface of the second wiring layer;

a semiconductor chip mounted on a first surface of the first protective film via a die bond material; and a sealing body that seals the semiconductor chip and the first surface of the first protective film of the wiring substrate, wherein a degree of flatness of a second surface of the first wiring layer on a side opposite to the first surface of the first wiring layer is lower than a degree of flatness of the first surface of the first wiring layer, the first wiring layer includes a first pattern, the second wiring layer includes a first pattern and a plurality of second patterns, the first pattern provided in the second wiring layer is arranged at a position overlapping the first pattern provided in the first wiring layer in a transparent plan view, a total area of the first pattern provided in the second wiring layer is larger than a total area of the plurality of second patterns provided in the second wiring layer in a plan view, and opening portions through which a surface of the second insulating layer is exposed are formed in the first pattern provided in the second wiring layer.

11. The semiconductor device according to claim 10, wherein the first pattern of the second wiring layer includes a plurality of lands exposed from the second protective film, the plurality of lands of the first pattern of the second wiring layer include a first land and a second land arranged to be adjacent to each other, and a first opening portion through which a part of the second insulating layer is exposed is formed between the first land and the second land.

12. The semiconductor device according to claim 11, wherein the first pattern of the second wiring layer includes a first region in which the plurality of lands are formed and a second region located outside the first region, the opening portions include the first opening portion and a second opening portion different from the first opening portion, the first opening portion is arranged in the first region, and the second opening portion is arranged in the second region, and a width of the first opening portion is narrower than a width of the second opening portion.

13. The semiconductor device according to claim 11, wherein a peripheral portion of each of the plurality of lands is covered with the second protective film, and each of the plurality of solder balls is provided to be bonded with each of the plurality of lands and the second protective film on the peripheral portion of each of the plurality of lands.

14. The semiconductor device according to claim 10, wherein an area of the first pattern provided in the second wiring layer is larger than an area of the semiconductor chip in a plan view.

15. The semiconductor device according to claim 10, wherein the first pattern provided in the second wiring layer is arranged inside the first pattern provided in the first wiring layer in a transparent plan view.

16. A semiconductor device comprising:

a wiring substrate including a first insulating layer, an upper first wiring layer pasted to a first surface of the first insulating layer, a first protective film covering a first surface of the upper first wiring layer, a lower first wiring layer pasted to a second surface of the first insulating layer on a side opposite to the first surface of the first insulating layer, a second insulating layer pasted to a first surface of the lower first wiring layer, a second wiring layer pasted to a first surface of the second insulating layer, and a second protective film covering the first surface of the second wiring layer;

a semiconductor chip mounted on a first surface of the first protective film via a die bond material; and a sealing body that seals the semiconductor chip and the first surface of the first protective film of the wiring substrate, wherein a degree of flatness of a second surface of the lower first wiring layer on a side opposite to the first surface of the lower first wiring layer is lower than a degree of flatness of the first surface of the lower first wiring layer, the lower first wiring layer includes a first pattern, the second wiring layer includes a first pattern and a plurality of second patterns, the first pattern provided in the second wiring layer is arranged at a position overlapping the first pattern provided in the lower first wiring layer in a transparent plan view, a total area of the first pattern provided in the second wiring layer is larger than a total area of the plurality of second patterns provided in the second wiring layer in a plan view, and opening portions through which a surface of the second insulating layer is exposed are formed in the first pattern provided in the second wiring layer.

\* \* \* \* \*